United States Patent
Feng et al.

(10) Patent No.: US 10,997,345 B2
(45) Date of Patent: May 4, 2021

(54) METHOD OF ETCH MODEL CALIBRATION USING OPTICAL SCATTEROMETRY

(71) Applicant: Lam Research Corporation, Fremont, CA (US)

(72) Inventors: Ye Feng, Portland, OR (US); Marcus Musselman, Oakland, CA (US); Andrew D. Bailey, III, Milpitas, CA (US); Mehmet Derya Tetiker, San Francisco, CA (US); Saravanapriyan Sriraman, Fremont, CA (US); Yan Zhang, Fremont, CA (US); Julien Mailfert, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/741,735

(22) Filed: Jan. 13, 2020

(65) Prior Publication Data
US 2020/0218844 A1 Jul. 9, 2020

Related U.S. Application Data

(63) Continuation of application No. 15/946,940, filed on Apr. 6, 2018, now Pat. No. 10,572,697.

(51) Int. Cl.
*G06F 30/367* (2020.01)
*G03F 1/36* (2012.01)
(Continued)

(52) U.S. Cl.
CPC ............ *G06F 30/367* (2020.01); *G03F 1/36* (2013.01); *G03F 1/78* (2013.01); *G03F 1/80* (2013.01); *G03F 1/86* (2013.01)

(58) Field of Classification Search
USPC .......................................................... 716/54
See application file for complete search history.

(56) References Cited

U.S. PATENT DOCUMENTS 5,114,233 A 5/1992 Clark et al.
5,421,934 A 6/1995 Misaka et al.
(Continued)

FOREIGN PATENT DOCUMENTS

CN 1501178 A 6/2004
CN 1739185 A 2/2006
(Continued)

OTHER PUBLICATIONS

U.S. Office Action, dated Jan. 25, 2018, issued in U.S. Appl. No. 14/972,969.
(Continued)

*Primary Examiner* — Bryce M Aisaka
(74) *Attorney, Agent, or Firm* — Weaver Austin Villeneuve & Sampson LLP

(57) ABSTRACT

Computer-implemented methods of optimizing a process simulation model that predicts a result of a semiconductor device fabrication operation to process parameter values characterizing the semiconductor device fabrication operation are disclosed. The methods involve generating cost values using a computationally predicted result of the semiconductor device fabrication operation and a metrology result produced, at least in part, by performing the semiconductor device fabrication operation in a reaction chamber operating under a set of fixed process parameter values. The determination of the parameters of the process simulation model may employ pre-process profiles, via optimization of the resultant post-process profiles of the parameters against profile metrology results. Cost values for, e.g., optical scatterometry, scanning electron microscopy and transmission electron microscopy may be used to guide optimization.

34 Claims, 6 Drawing Sheets

(51) Int. Cl.
*G03F 1/78* (2012.01)
*G03F 1/86* (2012.01)
*G03F 1/80* (2012.01)

(56) References Cited

U.S. PATENT DOCUMENTS

| | | |
|---|---|---|
| 6,268,226 B1 | 7/2001 | Angell et al. |
| 6,410,351 B1 | 6/2002 | Bode et al. |
| 6,650,423 B1 | 11/2003 | Markle et al. |
| 6,684,382 B2 | 1/2004 | Liu |
| 6,753,115 B2 | 6/2004 | Zhang et al. |
| 6,765,651 B1 | 7/2004 | Fiekowsky et al. |
| 6,804,572 B1 | 10/2004 | Cooperberg et al. |
| 6,903,826 B2 | 6/2005 | Usui et al. |
| 7,139,632 B2 | 11/2006 | Cooperberg et al. |
| 7,402,257 B1 | 7/2008 | Sonderman et al. |
| 7,504,182 B2 | 3/2009 | Stewart et al. |
| 7,588,946 B2 | 9/2009 | Tso et al. |
| 7,600,212 B2 | 10/2009 | Zach et al. |
| 7,739,651 B2 | 6/2010 | Melvin, III et al. |
| 7,812,966 B2 | 10/2010 | Hoffmann et al. |
| 7,849,423 B1 | 12/2010 | Yenikaya et al. |
| 7,962,867 B2 | 6/2011 | White et al. |
| 8,001,512 B1 | 8/2011 | White |
| 8,279,409 B1 | 10/2012 | Sezginer et al. |
| 8,832,610 B2 | 9/2014 | Ye et al. |
| 9,015,016 B2 | 4/2015 | Lorenz et al. |
| 9,471,746 B2 | 10/2016 | Rieger et al. |
| 9,547,740 B2 | 1/2017 | Moroz et al. |
| 9,659,126 B2 | 5/2017 | Greiner et al. |
| 9,792,393 B2 | 10/2017 | Tetiker et al. |
| 9,996,647 B2 | 6/2018 | Tetiker et al. |
| 10,032,681 B2 | 7/2018 | Bailey, III et al. |
| 10,197,908 B2 | 2/2019 | Sriraman et al. |
| 10,254,641 B2 | 4/2019 | Mailfert et al. |
| 10,303,830 B2 | 5/2019 | Tetiker et al. |
| 10,386,828 B2 | 8/2019 | Tetiker et al. |
| 10,534,257 B2 | 1/2020 | Tetiker et al. |
| 10,572,697 B2 | 2/2020 | Feng et al. |
| 10,585,347 B2 | 3/2020 | Sriraman et al. |
| 2003/0008507 A1 | 1/2003 | Bell et al. |
| 2003/0113766 A1 | 6/2003 | Pepper et al. |
| 2003/0208728 A1 | 11/2003 | Pierrat |
| 2004/0019872 A1 | 1/2004 | Lippincott et al. |
| 2005/0074907 A1 | 4/2005 | Kriz et al. |
| 2005/0192914 A1 | 9/2005 | Drege et al. |
| 2006/0064280 A1 | 3/2006 | Vuong et al. |
| 2006/0141484 A1 | 6/2006 | Rucker et al. |
| 2006/0208205 A1 | 9/2006 | Chen et al. |
| 2007/0031745 A1* | 2/2007 | Ye .................... G03F 7/705 430/30 |
| 2007/0050749 A1 | 3/2007 | Ye et al. |
| 2007/0061772 A1 | 3/2007 | Ye et al. |
| 2007/0061773 A1 | 3/2007 | Ye et al. |
| 2007/0249071 A1 | 10/2007 | Lian et al. |
| 2007/0281478 A1 | 12/2007 | Ikegami et al. |
| 2008/0007739 A1 | 1/2008 | Vuong et al. |
| 2008/0035608 A1 | 2/2008 | Thomas et al. |
| 2008/0243730 A1 | 10/2008 | Bischoff et al. |
| 2009/0048813 A1 | 2/2009 | Ichikawa et al. |
| 2009/0087143 A1 | 4/2009 | Jeon et al. |
| 2009/0253222 A1 | 10/2009 | Morisawa et al. |
| 2011/0022215 A1 | 1/2011 | Keil et al. |
| 2011/0159690 A1 | 6/2011 | Chandrashekar et al. |
| 2011/0188732 A1 | 8/2011 | Stroessner |
| 2011/0292375 A1 | 12/2011 | Marx et al. |
| 2012/0002912 A1 | 1/2012 | Studenkov et al. |
| 2012/0009785 A1 | 1/2012 | Chandrashekar et al. |
| 2012/0022836 A1 | 1/2012 | Ferns et al. |
| 2012/0228125 A1 | 9/2012 | Wu et al. |
| 2013/0171822 A1 | 7/2013 | Chandrashekar et al. |
| 2014/0032463 A1 | 1/2014 | Jin et al. |
| 2015/0056803 A1 | 2/2015 | Chandrashekar et al. |
| 2015/0079500 A1 | 3/2015 | Shih et al. |
| 2015/0142395 A1 | 5/2015 | Cao et al. |
| 2015/0154145 A1 | 6/2015 | Watanabe et al. |
| 2015/0366523 A1 | 12/2015 | Ben-Haim |
| 2015/0371134 A1* | 12/2015 | Chien ................ G06N 3/02 706/21 |
| 2016/0284077 A1 | 9/2016 | Brill |
| 2016/0313651 A1 | 10/2016 | Middlebrooks et al. |
| 2016/0322267 A1 | 11/2016 | Kim et al. |
| 2017/0039308 A1 | 2/2017 | Moroz et al. |
| 2017/0115556 A1 | 4/2017 | Shim et al. |
| 2017/0147724 A1 | 5/2017 | Regli et al. |
| 2017/0176983 A1 | 6/2017 | Tetiker et al. |
| 2017/0228482 A1 | 8/2017 | Tetiker et al. |
| 2017/0256463 A1 | 9/2017 | Bailey, III et al. |
| 2017/0351952 A1 | 12/2017 | Zhang et al. |
| 2017/0363950 A1 | 12/2017 | Sriraman et al. |
| 2017/0365513 A1 | 12/2017 | Yang et al. |
| 2017/0371991 A1 | 12/2017 | Tetiker et al. |
| 2018/0157161 A1 | 6/2018 | Mailfert et al. |
| 2018/0182632 A1 | 6/2018 | Feng et al. |
| 2018/0239851 A1 | 8/2018 | Ypma et al. |
| 2018/0260509 A1 | 9/2018 | Tetiker et al. |
| 2018/0314148 A1 | 11/2018 | Tetiker et al. |
| 2019/0049937 A1 | 2/2019 | Tetiker et al. |
| 2019/0250501 A1 | 8/2019 | Sriraman et al. |
| 2019/0311083 A1 | 10/2019 | Feng et al. |
| 2020/0242209 A1 | 7/2020 | Bowes et al. |
| 2021/0035833 A1 | 2/2021 | Feng et al. |

FOREIGN PATENT DOCUMENTS

| | | |
|---|---|---|
| CN | 1868043 A | 11/2006 |
| CN | 1940715 A | 4/2007 |
| CN | 101151719 A | 3/2008 |
| CN | 101313308 A | 11/2008 |
| CN | 101976045 A | 2/2011 |
| CN | 104103510 A | 10/2014 |
| CN | 104518753 A | 4/2015 |
| CN | 104736744 A | 6/2015 |
| JP | 2017-227892 A | 12/2017 |
| KR | 20170017789 A | 2/2017 |
| TW | 201415003 A | 4/2014 |
| WO | WO 2006/104655 A2 | 10/2006 |
| WO | WO 2018/204193 | 11/2018 |

OTHER PUBLICATIONS

U.S. Final Office Action, dated Aug. 27, 2018, issued in U.S. Appl. No. 14/972,969.
U.S. Office Action, dated Jan. 10, 2019, issued in U.S. Appl. No. 14/972,969.
U.S. Notice of Allowance, dated Apr. 5, 2019, issued in U.S. Appl. No. 14/972,969.
US Office Action, dated Mar. 22, 2017, issued in U.S. Appl. No. 15/018,708.
U.S. Notice of Allowance, dated Jun. 7, 2017, issued in U.S. Appl. No. 15/018,708.
U.S. Notice of Allowance, dated Feb. 6, 2018 issued in U.S. Appl. No. 15/698,458.
U.S. Office Action, dated Oct. 2, 2017, issued in U.S. Appl. No. 15/698,458.
Office Action dated Jun. 14, 2018 issued in U.S. Appl. No. 15/972,063.
Final Office Action dated Nov. 7, 2018 issued in U.S. Appl. No. 15/972,063.
Notice of Allowance dated Feb. 1, 2019 issued in U.S. Appl. No. 15/972,063.
U.S. Office Action, dated Aug. 10, 2017, issued in U.S. Appl. No. 15/059,073.
Notice of Allowance dated Jan. 11, 2018 issued in U.S. Appl. No. 15/059,073.
U.S. Office Action, dated Dec. 7, 2017, issued in U.S. Appl. No. 15/188,910.
U.S. Final Office Action, dated May 23, 2018 issued in U.S. Appl. No. 15/188,910.
U.S. Notice of Allowance, dated Sep. 27, 2018 issued in U.S. Appl. No. 15/188,910.

(56) References Cited

OTHER PUBLICATIONS

U.S. Office Action, dated Jul. 10, 2019 issued in U.S. Appl. No. 16/224,651.
U.S. Notice of Allowance, dated Oct. 30, 2019 issued in U.S. Appl. No. 16/224,651.
U.S. Office Action, dated Jul. 11, 2018 issued in U.S. Appl. No. 15/367,060.
U.S. Notice of Allowance, dated Nov. 26, 2018 issued in U.S. Appl. No. 15/367,060.
U.S. Notice of Allowance, dated Jul. 23, 2019 issued in U.S. Appl. No. 15/583,610.
U.S. Office Action dated Jul. 10, 2019 issued in U.S. Appl. No. 15/946,940.
U.S. Notice of Allowance dated Oct. 16, 2019 issued in U.S. Appl. No. 15/946,940.
U.S. Office Action, dated Mar. 4, 2019 issued in U.S. Appl. No. 15/673,321.
Chinese First Office Action dated Dec. 2, 2019 issued in Application No. CN 201611166040.9.
International Search Report and Written Opinion dated Aug. 10, 2018 issued in Application No. PCT/US2018/029874.
International Preliminary Report on Patentability dated Nov. 14, 2019 issued in Application No. PCT/US2018/029874.
Chinese First Office Action dated Feb. 25, 2019 issued in Application No. CN 201710121052.8.
International Search Report and Written Opinion dated Jul. 31, 2019 issued in Application No. PCT/US2019/026851.
International Search Report and Written Opinion dated Jul. 5, 2019 issued in Application No. PCT/US2019/025668.
Cooperberg, D.J., et al. (Sep./Oct. 2002) "Semiempirical profile simulation of aluminum etching in a $Cl_2$ / $BCl_3$ plasma," *Journal of Vacuum Science & Technology A.*, 20(5):1536-1556 [doi: http://dx.doi.org/10.1116/1.1494818].
"SEMulator3D," Product Brochure, Coventor, A Lam Research Company, 3 pp. (known as of Mar. 2, 2018) <URL:https://www.coventor.com/semiconductor-solutions/semulator3d/>.
"SEMulator3D Advanced Modeling," Web page, Coventor, A Lam Research Company, 5 pp. <URL: https://www.coventor.com/semiconductor-solutions/semulator3d/semulator3d-advanced-modeling/> (known as of Mar. 2, 2018).
"SEMulator3D," Web page, Coventor, A Lam Research Company, 5 pp. <URL:https://www.coventor.com/semiconductor-solutions/semulator3d/> (known as of Mar. 2, 2018).
Goodlin et al. (May 2002) "Quantitative Analysis and Comparison of Endpoint Detection Based on Multiple Wavelength Analysis," *201st Meeting of the Electrochemical Society, International Symposium on Plasma Processing XIV*, Abs. 415, Philadelphia, PA, 30 pages.
Hoekstra, R. et al. (Jul./Aug. 1997) "Integrated plasma equipment model for polysilicon etch profiles in an inductively coupled plasma reactor with subwafer and superwafer topography," *Journal of Vacuum Science & Technology A*, 15(4):1913-1921 [doi: http://dx.doi.org/10.1116/1.580659].
Hoekstra, R. et al. (Jul./Aug. 1998) "Microtrenching resulting from specular reflection during chlorine etching of silicon," *Journal of Vacuum Science & Technology B, Nanotechnology and Microelectronics*, 16(4):2102-2104 [doi: http://dx.doi.org/10.1116/1.590135].
Hoekstra, R. et al. (Nov. 1, 1998) "Comparison of two-dimensional and three-dimensional models for profile simulation of poly-Si etching of finite length trenches," *Journal of Vacuum Science & Technology A*, 16(6):3274-3280 [doi:http://dx.doi.org/10.1116/1.581533].
Huard, C.M., et al. (Jan. 17, 2017) "Role of neutral transport in aspect ratio dependent plasma etching of three-dimensional features," *Journal of Vacuum Science & Technology A.*, 35(5):05C301-1-05C301-18. [doi: http://dx.doi.org/10.1116/1.4973953].
Kushner, M.J., (Sep. 18, 2009) "Hybrid modelling of low temperature plasmas for fundamental investigations and equipment design," *Journal of Physics D.*, 42(1904013):1-20 [doi: 10.1088/0022-3727/42/19/194013].

Lynn et al. (2009) "Virtual Metrology for Plasma Etch using Tool Variables," *IEEE*, pp. 143-148.
Lynn, Shane (Apr. 2011) "Virtual Metrology for Plasma Etch Processes," *A thesis submitted in partial fulfillment for the degree of Doctor of Philosophy in the Faculty of Science and Engineering, Electronic Engineering Department*, National University of Ireland, Maynooth, 361 pages.
Moharam et al. (Jul. 1981) "Rigorous coupled-wave analysis of planar-grating diffraction," *J. Opt. Soc. Am.*, 71(7): 811-818.
Radjenović et al. (2007) "3D Etching profile evolution simulations: Time dependence analysis of the profile charging during SiO2 etching in plasma," *5th EU-Japan Joint Symposium on Plasma Process, Journal of Physics: Conference Series*, 86:13 pages.
Ringwood et al. (Feb. 2010) "Estimation and Control in Semiconductor Etch: Practice and Possibilities," *IEEE Transactions on Semiconductor Manufacturing*, 23(1): 87-98.
Sankaran, A. et al. (Jan. 15, 2005) "Etching of porous and solid $SiO_2$ in $Ar/c-C_4F_8$, $O_2/c-C_4F_8$ and $Ar/O_2/c-C_4F_8$ plasmas," *Journal of Applied Physics*, 97(2):023307-1-023307-10. [doi: http://dx.doi.org/10.1063/1.1834979] [retrieved on Jan. 29, 2005].
Sankaran, A. et al. (Jul./Aug. 2004) "Integrated feature scale modeling of plasma processing of porous and solid $SiO_2$. I. Fluorocarbon etching," *Journal of Vacuum Science & Technology A.*, 22(4): 1242-1259 [doi: http://dx.doi.org/10.1116/1.1764821].
Yue et al. (Jan./Feb. 2001) "Plasma etching endpoint detection using multiple wavelengths for small open-area wafers," *J. Vac. Sci. Technol. A*, 19(1):66-75.
Zeng (2012) "Statistical Methods for Enhanced Metrology in Semiconductor/Photovoltaic Manufacturing," A dissertation submitted in partial satifaction of the requirements for the degree of Doctor of Philosophy in Engineering—Electrical Engineering and Computer Sciences in the Graduate Division of the University of California, Berkeley, 171 pages.
Zhang, D. et al. (Mar./Apr. 2001) "Investigations of surface reactions during $C_2F6$ plasma etching of $SiO_2$ with equipment and feature scale models," *Journal of Vacuum Science & Technology A*, 19(2):524-538 [doi: http://dx.doi.org/10.1116/1.1349728].
Zhang, Y., (Sep. 30, 2015) Doctoral Dissertation of "Low Temperature Plasma Etching Control through Ion Energy Angular Distribution and 3-Dimensional Profile Simulation," *Dept. of Electrical Engineering at the University of Michigan*, pp. 49-71, Appendix B. pp. 243-248 [doi: http://hdl.handle.net/2027.42/113432].
U.S. Appl. No. 16/260,870, filed Feb. 14, 2019, Bowes et al.
US Office Action dated Mar. 17, 2020 issued in U.S. Appl. No. 16/260,870.
US Final Office Action dated Aug. 27, 2020 issued in U.S. Appl. No. 16/260,870.
Chinese First Office Action dated Mar. 11, 2020 issued in Application No. CN 201710475240.0.
Chinese Second Office Action dated Aug. 10, 2020 issued in Application No. CN 201710475240.0.
Singapore Notice of Eligibility for Grant and Supplemental Examination Report dated Jun. 22, 2020 issued in Application No. SG 10201705049V.
Chinese First Office Action dated Mar. 6, 2020 issued in Application No. CN 201710068974.7.
Taiwanese Notice of Allowance dated Jul. 17, 2020 issued in Application No. TW 106103883.
International Search Report and Written Opinion dated Jul. 22, 2019 issued in Application No. PCT/US2019/026396.
International Preliminary Report on Patentability dated Oct. 22, 2020 issued in Application No. PCT/US2019/026396.
International Preliminary Report on Patentability dated Oct. 22, 2020 issued in Application No. PCT/US2019/026851.
International Preliminary Report on Patentability dated Oct. 15, 2020 issued in Application No. PCT/US2019/025668.
International Search Report and Written Opinion dated Jun. 5, 2020 issued in Application No. PCT/US2020/015464.
Byrd, R.H., RB. Schnabel, and G.A. Shultz, "Approximate Solution of the Trust Region Problem by Minimization over Two-Dimensional Subspaces," Mathematical 5 Programming, vol. 40, pp. 247-263 (1988).

(56) References Cited

OTHER PUBLICATIONS

Cramer et al., "High-NA optical CD metrology on small in-cell targets enabling improved higher order 10 dose control and process control for logic," Proceedings of SPIE,10145, Metrology, Inspection, and Process Control for Microlithography XXXI, 101451B (Mar. 28, 2017).
More, J.J. and D.C. Sorensen, "Computing a Trust Region Step," SIAM Journal on Scientific and Statistical Computing, vol. 3, pp. 553-572, (1983).
More, J.J., "The Levenberg-Marquardt Algorithm: Implementation and Theory," Numerical Analysis, ed. G. A Watson, Lecture Notes in Mathematics 630, Springer Verlag, pp. 105-116 (1977).
U.S. Appl. No. 15/733,728, filed Oct. 6, 2020, Feng et al.
U.S. Appl. No. 17/045,168, filed Oct. 3, 2020, Sriraman et al.
U.S. Notice of Allowance dated Dec. 9, 2020 issued in U.S. Appl. No. 16/260,870.
Chinese Third Office Action dated Nov. 18, 2020 issued in Application No. CN 201710475240.0.
Taiwanese First Office Action dated Dec. 10, 2020 issued in Application No. TW 106120279.
Taiwanese First Office Action dated Dec. 7, 2020 issued in Application No. TW 106106609.
Japanese First Office Action dated Feb. 16, 2021 issued in Application No. JP 2017-020050.
European Extended Search Report dated Feb. 10, 2021 issued in EP Application No. EP 18794270.1.

\* cited by examiner

Reflectance Comparison Optimization System

Feature Profile Comparison Optimization System

Profile Parameter Comparison Optimization System

METHOD OF ETCH MODEL CALIBRATION USING OPTICAL SCATTEROMETRY

INCORPORATION BY REFERENCE

Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

The performance of semiconductor device fabrication operations such as plasma-assisted etch processes is often essential to the success of a semiconductor device processing workflow. However, optimization or tuning of the etch processes and/or the tools associated with them (e.g., etch reactors, lithography masks, etc.) may prove technically difficult and time-consuming, often involving skilled personnel manually adjusting etch process parameters or tool component designs to generate the desired target feature profile. Currently, no automated procedure, of sufficient accuracy, exists which may be relied upon to determine the values of process parameters responsible for a desired etch profile.

Certain models simulate the physical and/or chemical processes occurring on semiconductor substrate surfaces during etch processes. Examples of such models include etch profile models (EPMs) implemented as behavioral models (e.g., the SEMulator3D available from Coventor (a Lam Research Company) of Cary, N.C.) or implemented as models of surface reactions; see e.g., models of M. Kushner and co-workers as well as the those of Cooperberg and co-workers. The former are described in Y. Zhang, "Low Temperature Plasma Etching Control through Ion Energy Angular Distribution and 3-Dimensional Profile Simulation," Chapter 3, dissertation, University of Michigan (2015), and the latter in Cooperberg, Vahedi, and Gottscho, "Semiempirical profile simulation of aluminum etching in a $Cl_2/BCl_3$ plasma," J. Vac. Sci. Technol. A 20(5), 1536 (2002), both of which are hereby incorporated by reference in their entireties. Additional description of the etch profile models of M. Kushner and co-workers may be found in J. Vac. Sci. Technol. A 15(4), 1913 (1997), J. Vac. Sci. Technol. B 16(4), 2102 (1998), J. Vac. Sci. Technol. A 16(6), 3274 (1998), J. Vac. Sci. Technol. A 19(2), 524 (2001), J. Vac. Sci. Technol. A 22(4), 1242 (2004), J. Appl. Phys. 97, 023307 (2005), each of which is also hereby incorporated by reference in its entirety. Additional description of etch profile models of Coventor can be found in U.S. Pat. No. 9,015,016 filed Nov. 25, 2008 by Lorenz et al., and U.S. Pat. No. 9,659,126 filed Jan. 26, 2015 by Greiner et al., each of which is also hereby incorporated by reference in its entirety. Such disclosed models may benefit from further development to approach the degree of accuracy and reliability desired by the semiconductor processing industry.

Background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

An aspect of this disclosure provides a computer-implemented method of optimizing a process simulation model that predicts a result of a semiconductor device fabrication operation from process parameter values characterizing the semiconductor device fabrication operation. The method may be characterized by the following operations: (a) receiving current values of one or more floated process model parameters to be optimized; (b) producing a configured process simulation model by providing to the process simulation model the current values of the one or more floated process model parameters; (c) generating, using the configured process simulation model, a computationally predicted result of the semiconductor device fabrication operation; (d) comparing the computationally predicted result with a metrology result obtained from one or more substrate features produced, at least in part, by performing the semiconductor device fabrication operation, where the comparing produces one or more cost values based on a difference between the computationally predicted result of the semiconductor device fabrication operation and the metrology result; (e) using the one or more cost values and/or a convergence check to generate an update of the current values of the one or more floated process model parameters; (f) re-performing operation (b) with the update of the current values of the one or more floated process model parameters; and (g) repeating (c)-(f) until the current values of the one or more floated process model parameters converge to produce final values of the one or more floated process model parameters that minimize the cost values.

In certain embodiments, the process simulation model is additionally configured with a set of fixed process model parameter values in (b), and the metrology result is obtained from one or more substrate features produced by performing the semiconductor device fabrication operation in a reaction chamber operating under the set of fixed process parameter values. In certain embodiments, the set of fixed process model parameter value(s) or the one or more floated process model parameters include one or more values of temperature in the reaction chamber, one or more RF conditions in the reaction chamber, one or more process gases in in the reaction chamber, a pressure in the reaction chamber, or any combination thereof.

In certain embodiments, the semiconductor device fabrication operation is a subtractive process or a material additive process. In certain embodiments, the semiconductor device fabrication operation is an etch process, a planarization process, or a deposition process.

In certain embodiments, the one or more floated process model parameters include a characteristic of a substrate undergoing the semiconductor device fabrication operation, wherein the characteristic is a reaction rate constant, a reactant and/or product sticking coefficient, a reactant diffusion constant, a product diffusion constant, and/or an optical dispersion property. In certain embodiments, the one or more floated process model parameters includes a vertical etch rate, a lateral etch rate, a nominal etch depth, an etch selectivity, a tilt angle of ion entry, a twist angle of ion entry, a visibility into a feature, an angular distribution, a sputter maximum yield angle, and/or an etch ratio per crystal direction. In certain embodiments, the one or more floated process model parameters includes a combination of any two or more characteristics of a substrate undergoing the semiconductor device fabrication operation.

In certain embodiments, producing a configured process simulation model in (b) additionally includes providing to the process simulation model a profile of a substrate before the substrate is subjected to the semiconductor device fabrication operation, where the profile of the substrate has one or more features that are to be modified by the semiconductor device fabrication operation.

In certain embodiments, the method additionally includes, prior to (c), providing an initial profile of a substrate undergoing the semiconductor device fabrication operation, whereby generating the computationally predicted result of the semiconductor device fabrication operation in (c) uses the initial profile. In certain embodiments, the initial profile is generated computationally using information about a fabrication step that occurs prior to the semiconductor device fabrication operation. In certain embodiments, the initial profile is determined by conducting metrology on one or more initial substrate features produced from a fabrication step that occurs prior to the semiconductor device fabrication operation.

In certain embodiments, the result of a semiconductor device fabrication operation is a signal produced by interaction of incident electromagnetic radiation with an etched feature, a deposited feature, or a planarized feature. In certain embodiments, generating the computationally predicted result of the semiconductor device fabrication operation includes the following operations: (i) generating, using the configured process simulation model, a computed etch profile represented by a series of geometric profile coordinates; and (ii) from the computed etch profile generated in (i), generating a computed reflectance or ellipsometric spectrum by simulating reflection of electromagnetic radiation off of said computed etch profile. In some cases, the method additionally includes, prior to (ii), profile conditioning the computed etch profile to smooth some stochastic profile variations. In certain embodiments, generating a computed reflectance or ellipsometric spectrum involves performing a Rigorous Coupled Wave Analysis ("RCWA") simulation using the computed etch profile. In certain embodiments, generating the computed reflectance or ellipsometric spectrum involves performing a Finite Difference Time-Domain ("FDTD") simulation using the computed etch profile. In certain embodiments, the method additionally includes: performing the semiconductor device fabrication operation on a test substrate under the set of process parameter values to produce an etched substrate; and exposing the etched substrate to incident electromagnetic radiation to produce an experimental reflection spectrum comprising the metrology result. In certain embodiments, the method further includes generating one or more additional computed reflectance or ellipsometric spectra. In certain embodiments, the method additional includes producing the metrology result by performing reflectometry, dome scatterometry, angle-resolved scatterometry, small-angle X-ray scatterometry and/or ellipsometry on a substrate comprising features produced by performing the semiconductor device fabrication operation in the reaction chamber operating under the set of process parameter values.

In certain embodiments, the result of a semiconductor device fabrication operation is a profile of an etched feature, a profile of a deposited feature, and/or a profile of a planarized feature. In certain embodiments, generating the computationally predicted result of the semiconductor device fabrication operation includes generating, using the configured process simulation model, a computed etch profile represented by etch profile coordinates. In such embodiments, the method may additionally include: performing the semiconductor device fabrication operation on a test substrate under the set of process parameter values to produce an etched substrate; and measuring features of the etched substrate to produce experimental etch profile coordinates comprising the metrology result. In certain embodiments, measuring features of the etched substrate includes performing microscopy, or optical metrology on the etched substrate. In some cases, performing microscopy involves performing transmission electron microscopy (TEM) and/or scanning electron microscopy (SEM).

In certain embodiments, the result of a semiconductor device fabrication operation is a set of geometric profile parameters characterizing a geometry of an etched feature, a deposited feature, or a planarized feature. The geometric profile parameters may be Optical Critical Dimension ("OCD") profile parameters. In certain embodiments, generating the computationally predicted result of the semiconductor device fabrication operation includes: (i) generating, using the configured process simulation model, a computed etch profile represented by a series of etch profile coordinates; and (ii) converting the computed etch profile generated in (i) to a first set of geometric profile parameters characterizing a geometry of the of the computed etch profile. In such embodiments, the method may additionally include: performing the semiconductor device fabrication operation on a test substrate under the set of process parameter values to produce an etched substrate; measuring features of the etched substrate to produce experimental etch profile coordinates; and converting the experimental etch profile coordinates to a second set of geometric profile parameters characterizing a geometry of the of an etched feature in the etched substrate. Further in such embodiments, the one or more cost values may be based on a difference between the computationally predicted result that uses the first set of geometric profile parameters and the metrology result that uses the second set of geometric profile parameters.

In certain embodiments, the computationally predicted result generated in (c) includes a sequence of geometric profiles or profile parameters of a substrate feature computed from the configured process simulation model and corresponding to a sequence of times representing different durations of a substrate subtractive process or a substrate additive process. In certain embodiments, the metrology result of (d) includes a sequence of geometric profiles or profile parameters of the substrate feature obtained from experimental measurements of a substrate at the different durations of the substrate subtractive process or the substrate additive process.

In certain embodiments, the method additionally includes: (i) configuring the process simulation model with the final values of the one or more floated process model parameters from (g); and (ii) using the process simulation model configured with the final values of the one or more floated process model parameters from (g) to enable: determining a pattern of a lithographic mask, and creating the lithographic mask. In some cases, creating the lithographic mask includes transferring the pattern to a resist layer. In some such cases, the method additionally includes developing the resist layer and transferring the pattern to an underlying chrome layer.

In certain embodiments, the method additionally includes: (i) configuring the process simulation model with the final values of the one or more floated process model parameters from (g); (ii) using the process simulation model configured with the final values of the one or more floated process model parameters from (g) to enable: identifying a design of a semiconductor processing apparatus, and fabricating the semiconductor processing apparatus by using the design of the semiconductor processing apparatus.

In certain embodiments, the method additionally includes: (i) configuring the process simulation model with the final values of the one or more floated process model parameters from (g); (ii) using the process simulation model configured with the final values of the one or more floated process model parameters from (g) to identify operating conditions of a semiconductor processing apparatus to enable fabrication of semiconductor devices by operating the semiconductor processing apparatus under the operating conditions.

In some embodiments, repeating (c)-(f) includes identifying a substantially local or global minimum in the one or more cost values are obtained. In certain embodiments, the method additionally includes obtaining the metrology result by performing in situ metrology in the reaction chamber, nondestructive standalone metrology outside the reaction chamber, and/or standalone destructive metrology outside the reaction chamber.

In some embodiments, generating the computationally predicted result includes using the configured process simulation model to calculate local reaction rates at a grid of points representing a feature profile on a semiconductor substrate. In some such embodiments, using the configured process simulation model to calculate local reaction rates calculates reaction rates as a function of time.

Another aspect of the disclosure pertains to a computer program product including a non-transitory computer readable medium on which is provided instructions for causing a computational system to execute an optimized process simulation model that calculates a result of a semiconductor device fabrication operation from process parameter values characterizing the semiconductor device fabrication operation. The instructions include instructions for: (a) receiving process parameter values as inputs to the optimized process simulation model; (b) executing the optimized process simulation model using the process parameter values; and (c) outputting a calculated result of the semiconductor device fabrication operation. In certain embodiments, the optimized process simulation model was optimized by one of the methods described above. As an example, process simulation model was optimized by: (i) receiving current values of one or more floated process model parameters to be optimized, (ii) producing a configured process simulation model by providing to the process simulation model the current values of the one or more floated process model parameters and a set of fixed process model parameter value(s), (iii) generating, using the configured process simulation model, a computationally predicted result of the semiconductor device fabrication operation, (iv) comparing the computationally predicted result of the semiconductor device fabrication operation with a metrology result obtained from one or more substrate features produced, at least in part, by performing the semiconductor device fabrication operation in a reaction chamber operating under the set of fixed process parameter values, where the comparing produces one or more cost values based on a difference between the computationally predicted result of the semiconductor device fabrication operation and the metrology result, (v) using the one or more cost values and/or a convergence check to generate an update of the current values of the one or more floated process model parameters, (vi) performing operation (ii) with the update of the current values of the one or more floated process model parameters, and (vii) repeating (iii)-(vi) until the current values of the one or more floated process model parameters converge to produce final values of the one or more floated process model parameters that minimize the cost values.

The process simulation model associated with the computer program product may have been optimized by any of the operations described above in the method of optimizing a process simulation model aspect of the disclosure. In certain embodiments, the instructions further comprise, prior to (b), receiving an initial profile of a substrate undergoing the semiconductor device fabrication operation.

In certain embodiments, the one or more floated process model parameters include a vertical etch rate, a lateral etch rate, a nominal etch depth, an etch selectivity, a tilt angle of ion entry, a twist angle of ion entry, a visibility into a feature, an angular distribution, a sputter maximum yield angle, and/or an etch ratio per crystal direction. In certain embodiments, (ii) producing a configured process simulation model further includes providing to the process simulation model a profile of a substrate before the substrate is subjected to the semiconductor device fabrication operation, where the profile of the substrate has one or more features that are to be modified by the semiconductor device fabrication operation.

In certain embodiments, the result of a semiconductor device fabrication operation is a signal produced by interaction of incident electromagnetic radiation with an etched feature, a deposited feature, or a planarized feature. In certain embodiments, generating the computationally predicted result of the semiconductor device fabrication operation includes: generating, using the configured process simulation model, a computed etch profile represented by a series of geometric profile coordinates; and, from the computed etch profile, generating a computed reflectance or ellipsometric spectrum by simulating reflection of electromagnetic radiation off of said computed etch profile. In certain embodiments, the optimized process simulation model was optimized by additionally: performing the semiconductor device fabrication operation on a test substrate under the set of process parameter values to produce an etched substrate; and exposing the etched substrate to incident electromagnetic radiation to produce an experimental reflection spectrum comprising the metrology result.

In certain embodiments, the optimized process simulation model was optimized by additionally: producing the metrology result by performing reflectometry, dome scatterometry, angle-resolved scatterometry, small-angle X-ray scatterometry and/or ellipsometry on a substrate comprising features produced by performing the semiconductor device fabrication operation in the reaction chamber operating under the set of process parameter values. In certain embodiments, generating the computationally predicted result of the semiconductor device fabrication operation comprises generating, using the configured process simulation model, a computed etch profile represented by etch profile coordinates. In some such embodiments, the optimized process simulation model was optimized by additionally:performing the semiconductor device fabrication operation on a test substrate under the set of process parameter values to produce an etched substrate; and measuring features of the etched substrate to produce experimental etch profile coordinates comprising the metrology result.

In certain embodiments, the result of a semiconductor device fabrication operation is a set of geometric profile parameters characterizing a geometry of an etched feature, a deposited feature, or a planarized feature. In some such embodiments, the geometric profile parameters are Optical Critical Dimension ("OCD") profile parameters. In certain embodiments, generating the computationally predicted result of the semiconductor device fabrication operation includes: generating, using the configured process simulation model, a computed etch profile represented by a series of etch profile coordinates; and converting the computed etch profile to a first set of geometric profile parameters characterizing a geometry of the of the computed etch profile. In some such embodiments, the optimized process simulation model was optimized by additionally: performing the semiconductor device fabrication operation on a test substrate under the set of process parameter values to produce an etched substrate; measuring features of the etched substrate to produce experimental etch profile coordinates; and converting the experimental etch profile coordinates to a second set of geometric profile parameters characterizing a geometry of the of an etched feature in the etched substrate.

In certain embodiments, the instructions additionally include instructions for using the calculated result to determine a pattern of a lithographic mask. In certain embodiments, the instructions additionally include instructions for using the calculated result to identify a design of a semiconductor processing apparatus. In certain embodiments, the instructions additionally include instructions for using the calculated result to identify operating conditions of a semiconductor processing apparatus to enable fabrication of semiconductor devices by operating the semiconductor processing apparatus under the operating conditions.

Another aspect of the disclosure pertains to a system including a computer program product as described above and a lithography mask generating apparatus configured to determine a lithographic mask pattern using the calculated result of the semiconductor device fabrication operation. The process simulation model associated with this system may have been optimized by any of the operations described above in the method of optimizing a process simulation model aspect of the disclosure.

Another aspect of the disclosure pertains to a system including a computer program product as described above and a semiconductor processing apparatus configured to operate under process conditions provided in the calculated result of the semiconductor device fabrication operation. The process simulation model associated with this system may have been optimized by any of the operations described above in the method of optimizing a process simulation model aspect of the disclosure.

Another aspect of the disclosure pertains to methods of using a process simulation model to predict a result of a semiconductor device fabrication operation (such as etching, planarizing, or depositing material) and using the result to improve operation of the semiconductor device fabrication operation. Such use includes, for example, generating an improved mask layout (which may implemented in a mask), designing an improved reactor for performing the semiconductor device fabrication operation, and/or defining a process window for the semiconductor device fabrication operation. The process simulation model used in this aspect of the disclosure may have been optimized by any of the operations described above in the method of optimizing a process simulation model aspect of the disclosure.

These and other features will be described below with reference to the associated drawings.

BRIEF DESCRIPTION OF THE DRAWINGS

Exemplary embodiments will now be described in conjunction with the drawings, in which.

DETAILED DESCRIPTION

Introduction

Disclosed herein are methods and/or procedures for improving the utility of process simulation models such as etch profile models (EPMs) referred to above (and/or other similar models) such that the process simulation models may be used to generate representations of semiconductor feature profiles, resulting from semiconductor device fabrication operations, with a level of accuracy acceptable to the semiconductor processing industry. Generally, the disclosed methods improve upon the predictive capabilities of the process simulation models.

Process simulation models may simulate the "evolution" of a substrate surface profile, e.g., sequential changes to a feature's etch profile as measured over time, or time-dependent changes in the shape of a feature at various spatial locations on the feature's surface, by calculating reaction rates or other process parameters associated with the etch process at each of many spatial locations. Variance in the reaction rates may result from flux of etchant, the characteristics of the selected deposition material, the plasma conditions of the reaction chamber, or any of a number of other factors. Further, calculated reaction rates may fluctuate over the course of the simulated etch process. Not all process simulation models simulate the evolution over the course of a semiconductor device fabrication operation; some simply predict the final profile given reaction conditions (including the duration of the operation) and an initial feature profile.

Figure 2:
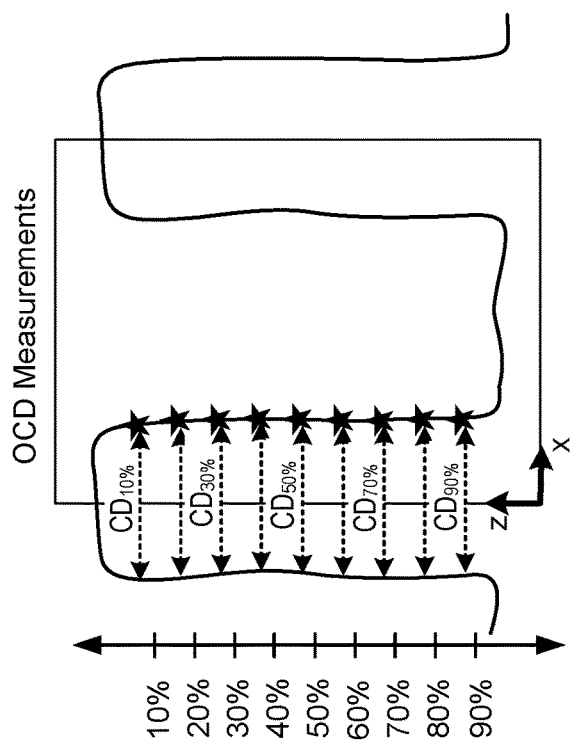
FIG. 2 represents an example of an etch profile, similar to that shown in FIG. 1, but in this figure, computed from experimental measurements made with one or more metrology tools.
Figure 1:
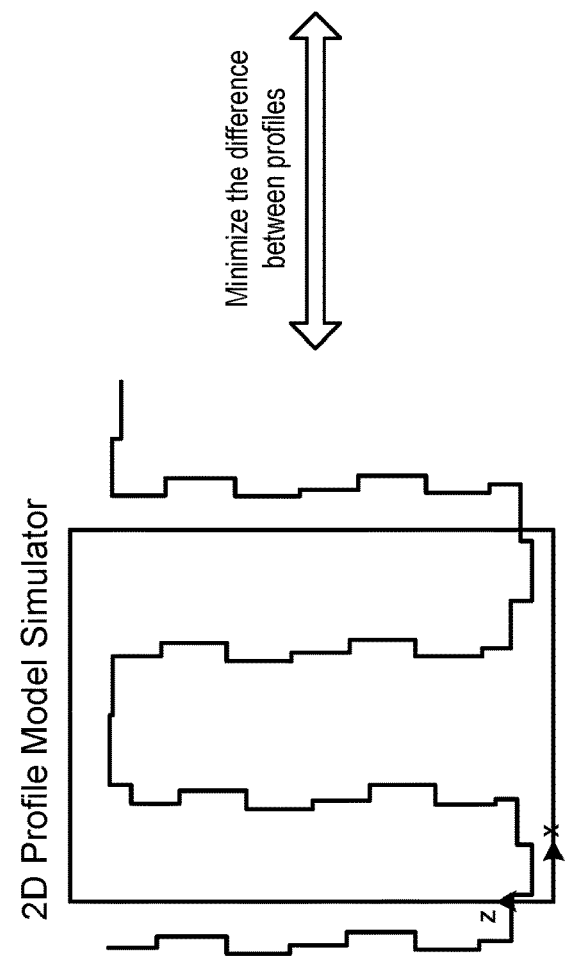
FIG. 1 represents an example of an etch profile as generated computationally from an etch profile model of an etch process.

In some embodiments, output of a simulated etch profile may be represented by a discrete set of data points, i.e. profile coordinates, which spatially define and/or otherwise map out the shape of the profile, as shown in FIG. 1. Further, the simulated profile shown in FIG. 1 may correspond to an actual measured etch profile as shown in FIG. 2. The simulated etch profile's evolution over time depends on the modelled, spatially-resolved local etch rates which, in turn, depend on the underlying chemistry and physics of the etch process.

Accordingly, profile simulation as, for example, conducted by an EPM, may depend on various physical and/or chemical parameters associated with the chemical reaction mechanisms underlying device fabrication processes, and also any physical and/or chemical parameters which may characterize the chamber environment, such as (but not limited to): temperature, pressure, plasma power, reactant flow rate, etc. Such parameters typically are under the control of a process engineer.

Process simulation models that rely on representations of surface reactions may employ a set of core, or "fundamental," chemical and/or physical input parameters, examples include (but are not otherwise limited to): reaction probabilities, sticking coefficients, ion and neutral fluxes, etc. The parameters may or may not be controllable independently of one another. Further, in certain process situations and/or configurations, a process engineer managing the fabrication process may be unaware of one or more of the parameters, which are nevertheless required to run the process simulation model. Such parameters may be assumed to have certain values, which may be taken from literature, where their use invokes certain simplifications of (and/or approximations to) the underlying physical and chemical mechanisms behind the process being modeled.

The disclosed methods and/or processes combine experimental techniques and data analysis methodologies to improve the practical industrial applicability of process simulation models for semiconductor device fabrication operations that modify substrates.

In certain embodiments, the techniques disclosed herein optimize chemical, physical, and/or behavioral input parameter values—sometimes referred to as "floated" process model parameter values—which are used by these models, and improve the predictive accuracy of the models by determining more effective sets of values for the parameters. Optimizing the parameters improves the accuracy of the process simulation model in which they are used, even in circumstances where optimum values determined for the fundamental parameters may differ than what literature (or other experiments) might determine as the "true," or ideal, physical/chemical values for these parameters. The parameters to be optimized do not necessarily directly correspond to particular chemical or physical properties or mechanisms of the etch process. In some cases, they simply represent parameters that allow the model to accurately predict etch results for a given set of inputs such as reactor conditions.

Process simulation models may consider physical properties and/or measurable quantities within process equipment, as well as substrate and/or semiconductor wafer properties at the nanometer level. However, not all wafer properties may be conveniently measured directly, i.e. often requiring the cutting and/or setting-aside of substrate samples to be observed and/or scanned via microscopy, such as scanning electron microscopy (SEM) and other metrological techniques.

Definitions

The following terms may be intermittently used throughout the instant specification:

In this application, the terms "semiconductor wafer," "wafer," "substrate," "wafer substrate" and "partially fabricated integrated circuit" may be used interchangeably. Those of ordinary skill in the art understand that the term "partially fabricated integrated circuit" can refer to a semiconductor wafer during any of many stages of integrated circuit fabrication thereon. A wafer or substrate used in the semiconductor device industry typically has a diameter of 200 mm, or 300 mm, or 450 mm. This detailed description assumes the embodiments are implemented on a wafer. However, the disclosure is not so limited. The work piece may be of various shapes, sizes, and materials. Besides semiconductor wafers, other work pieces that may take advantage of the disclosed embodiments include various articles such as printed circuit boards, magnetic recording media, magnetic recording sensors, mirrors, optical elements, micro-mechanical devices and the like.

A "feature" as used herein is non-planar structure on a substrate surface, typically a surface being modified in a semiconductor device fabrication operation. Examples of features include trenches, vias, pads, pillars, domes, and the like. Features may be created by photoresist development, mask definition, lithographic etching, lithographic deposition, epitaxial growth, damascene deposition, and the like. A feature typically has an aspect ratio (depth or height to width). Examples of feature aspect ratios include aspect ratio of at least about 1:0.5, at least about 1:1, at least about 2:1, at least about 5:1, at least about 10:1, or higher. In certain embodiments, a feature has a width dimension (which may be a critical dimension) of between about 10 nm to 500 nm, for example between about 25 nm and about 300 nm. A feature profile may narrow gradually and/or include an overhang at the feature opening. A re-entrant profile is one that narrows from the bottom or interior of the feature to the feature opening.

An "initial profile" as used herein is a profile of the geometry of a substrate surface that will be processed by a semiconductor device fabrication operation. The initial profile may have one or more features (or it may be fully planar) and it serves as the starting or input profile for the semiconductor device fabrication operation, which will then modify the initial profile. The initial profile may be generated computationally using information about a fabrication step that precedes the semiconductor device fabrication operation. Alternatively, the initial profile is generated by conducting metrology on a substrate surface produced from the fabrication step that precedes the semiconductor device fabrication operation. During a semiconductor device fabrication operation, real or simulated, the substrate surface is modified from the initial profile to a final profile.

A "semiconductor device fabrication operation" as used herein is a unit operation performed during fabrication of semiconductor devices. Typically, the overall fabrication process includes multiple semiconductor device fabrication operations, each performed in its own semiconductor fabrication tool such as a plasma reactor, an electroplating cell, a chemical mechanical planarization tool, a wet etch tool, and the like. Categories of semiconductor device fabrication operations include subtractive processes, such as etch processes and planarization processes, and material additive processes, such as deposition processes. In the context of etch processes, a substrate etch process includes processes that etch a mask layer or, more generally, processes that etch any layer of material previously deposited on and/or otherwise residing on a substrate surface. Such etch process may etch a stack of layers in the substrate.

A "result of a semiconductor device fabrication operation" as used herein is a characteristic of a substrate subjected to a semiconductor fabrication operation. One example of such result is a geometric profile of a substrate after the semiconductor fabrication operation. The profile is a set of points in space representing the positions of a feature or a group of features. As examples, the profile may be a profile of an etched feature, a profile of a deposited feature, a profile of a planarized feature, and the like. In another example, the result of a semiconductor fabrication operation is a signal produced by interaction of incident electromagnetic radiation with one or more substrate features such as an etched feature, a deposited feature, or a planarized feature. In such examples, the result may be, e.g., a reflectance signal which may include reflectance magnitude as a function of wavelength and/or polarization state. The result may also be an ellipsometric signal. In another example, the result of a semiconductor fabrication operation is a set of profile parameters, such as Optical Critical Dimension ("OCD") profile parameters, that characterize a geometry of the of a feature such as an etched feature, a deposited feature, or a planarized feature. Such profile parameters may characterize overall characteristics of a feature such as its average critical dimension, its side wall angles, its depth, and the like.

The result of a semiconductor fabrication operation may be obtained at one time point or over multiple time points during the semiconductor fabrication operation. If the result is provided at only one time point, it may be the point at which the semiconductor fabrication operation is complete.

A "computationally predicted result of the semiconductor device fabrication operation" as used herein is a predicted result of the semiconductor device fabrication operation produced computationally such as a by a computational model, e.g., a process simulation model for the device fabrication operation under consideration. In certain embodiments, a computational process calculates a predicted feature profile represented by geometric profile coordinates. In other cases, the computational process calculates a predicted optical response produced by electromagnetic radiation interacting with a predicted feature profile. In still other cases, the computational process calculates predicted geometric profile parameters of the feature profile (e.g., a set of OCD profile parameters characterizing a geometry of the computed etch profile), as produced by the semiconductor device fabrication operation. In some embodiments, feature profiles, optical responses, and/or profile parameters are computed as a function time (over which the semiconductor device fabrication operation occurs). In certain embodiments, to predict the result of the semiconductor device fabrication operation, the computation process predicts local reaction rates at a grid of points representing a feature profile on a semiconductor substrate. This results in a substrate/feature profile that deviates from an initial profile used at the beginning of the computations.

Where the computational process calculates a predicted optical response, it may compute a reflectance spectrum or ellipsometric response by simulating reflection of electromagnetic radiation off of said computed etch profile. The reflectance spectrum or ellipsometric response may be generated using, for example, a Rigorous Coupled Wave Analysis ("RCWA") simulation or a Finite Difference Time-Domain ("FDTD") simulation.

In certain embodiments, the computational process produces a time sequence of geometric profiles or profile parameters of a substrate feature. In certain embodiments, the computational process produces a time sequence of computed reflectance spectra or ellipsometric response generated by simulating reflection of electromagnetic radiation off of a computed substrate feature profile at different times. The time sequence may be produced at different durations of the semiconductor device fabrication operation. The computationally predicted result of the semiconductor device fabrication operation may be provided for substrate subtractive processes and/or substrate additive processes.

The term "profile conditioning" as used herein refers to a smoothing of the computed etch profile to smooth some stochastic profile variations. Profile conditioning may be applied to the computationally predicted result of the semiconductor device fabrication operation before another computational process such as simulating reflection of electromagnetic radiation off of said computed etch profile.

A "metrology result" as used herein refers to a result produced, at least in part, by measuring features of the processed substrate. The measurement may be made while or after performing the semiconductor device fabrication operation in a reaction chamber operating under the set of fixed process parameter values. In certain embodiments, measuring features of the processed substrate produces profile coordinates. In such embodiments, measuring features of the processed substrate may include performing microscopy (e.g., SEM, TEM, STEM, REM, AFM), or optical metrology on the etched substrate. When using optical metrology, the system may obtain profile coordinates by calculating them from measured optical metrology signals. In certain embodiments, the metrology result is produced by converting measured feature profile coordinates to a set of geometric profile parameters characterizing a geometry of the feature in the processed substrate (e.g., critical dimension, side wall angles, depth, etc.). In certain embodiments, the metrology result is produced by performing reflectometry, dome scatterometry, angle-resolved scatterometry, small-angle X-ray scatterometry and/or ellipsometry on a processed substrate. In certain embodiments, the metrology result is endpoint detection for a particular process. The endpoint detection, which may be determined in situ, may be measured by various optical techniques.

In certain embodiments, the metrology result is provided as a time sequence of measured geometric profiles, reflectance or ellipsometric data, or profile parameters of a substrate feature. These measured metrology results are produced at the different durations of the semiconductor device fabrication operation.

A "process simulation model" as used herein is a computational model that predicts a result of a semiconductor device fabrication operation. In other words, it outputs the result. As explained, examples of results include feature profiles (e.g., detailed Cartesian coordinates of a feature), profile parameters characterizing a feature (e.g., critical dimension, sidewall angles, depth, etc.), and/or reflectance/ellipsometric data created if optical metrology was used to probe features. The results are based on features produced or modified during the simulated semiconductor device fabrication operation. The results may be predicted at one or more times during the semiconductor device fabrication operation.

Inputs to the process simulation model include one or more process parameter values that characterize the semiconductor device fabrication operation. Often process parameters used as inputs are reactor conditions such as temperature (pedestal, showerhead, etc.), plasma conditions (density, potential, power, etc.), process gas conditions (composition such partial pressures of components, flow rate, pressure, etc.), and the like. Typically, the process simulation model also receives an initial profile substrate, which represents the profile of the substrate surface immediately before being processed via the modeled semiconductor device fabrication operation. In a simple case, the initial profile is a simply a planar surface. More typically, initial profile has features such as mask or photoresist features.

Sometimes, the process simulation model simulates a subtractive process such as a substrate etch process or a planarization process. In various embodiments, the process simulation model is an etch profile model as described herein. Sometimes, the process simulation model simulates an additive process such as a substrate deposition process (e.g., chemical vapor deposition, physical vapor deposition, atomic layer deposition, etc.).

A "configured process simulation model" as used herein describes a process simulation model configured with one or floated process model parameters. When so configured, and after receiving the input process parameters and the substrate initial profile, a process simulation model can execute to predict a result of a semiconductor device fabrication operation.

A "process parameter" as used herein is a parameter that characterizes a process occurring in reaction chamber during a semiconductor device fabrication operation, often on a substrate surface being modified by the operation. Typically, many such process parameters are needed to uniquely characterize the process. Some process parameters characterize aspects of the process that are relatively easy to control and/or measure. Examples of such process parameters include temperature (of a pedestal, showerhead, etc.), plasma conditions (plasma density, plasma potential, applied power, etc.), process gas conditions (composition such partial pressures of components, flow rate, pressure, etc.), and adjustable chamber geometry parameters such as separation between the pedestal and showerhead. Other process parameters characterize aspects of the process that are not directly controllable and/or are not easily measured. Examples of such process parameters include local conditions such as plasma density, direction, or energy at a location on the substrate surface, and mechanistic characteristics such as a reaction rate constant, a reactant and/or product sticking coefficient, a reactant diffusion constant, a product diffusion constant, an optical dispersion property, and combinations thereof. A value of the process parameter is used as an input to or configuration of a process simulation model. The value may be a scalar, a vector, matrix, a tensor, etc.

A "fixed process model parameter" as used herein is a process parameter required by a process simulation model but whose value is fixed during an optimization process used to improve the performance of the process simulation model. In other words, a value of fixed process model parameter does not change during the optimization process. This is distinct from a floated process model parameter, whose value changes during the optimization exercise. In some embodiments, a fixed process model parameter is directly controllable and/or easy to measure. Examples include a temperature in a reaction chamber, one or more applied radio frequency or plasma conditions in the reaction chamber, one or more process gas conditions in in the reaction chamber, a pressure in in the reaction chamber, or any combination thereof. However, a fixed process model parameter may alternatively be local or mechanistic parameter. Sometimes for convenience in a model optimization process described herein, a value of a fixed process model parameter or a group of such values is represented by the symbol $\mu$.

A "floated process model parameter" as used herein is a process parameter required by a process simulation model but whose value floats (changes, adjusts, etc.) during an optimization process. An iterative modification of a floated process model parameter value from an initial or seed value to a final value is a goal of the model optimization process. If the optimization routine succeeds, a process simulation model configured with a final value of the floated process model parameter provides better predictive capability than a process simulation model configured with the initial value of the floated process model parameter. Sometimes for convenience in a model optimization process described herein, a value of a fixed process model parameter or a group of such values is represented by the symbol $\alpha$.

In certain embodiments, a floated process model parameter represents a characteristic of a substrate undergoing the semiconductor device fabrication operation. General examples include difficult to measure local conditions in a reactor and/or mechanistic properties of reactions during the semiconductor device fabrication operation. In some examples, the characteristic is a reaction rate constant, a reactant and/or product sticking coefficient, a reactant diffusion constant, a product diffusion constant, local plasma properties (e.g., ion flux, ion direction, radical flux, etc. at the substrate surface), an optical dispersion property, or any combination thereof. However, the floated process model parameter is not limited to such parameters. Parameters that might more typically be used as fixed process model parameters may also be used or used as or as a part of the floated process model parameter(s). Examples of such non-mechanistic parameters include a temperature in the reaction chamber, one or more RF conditions in the reaction chamber, one or more process gases in in the reaction chamber, a pressure in in the reaction chamber, applied plasma conditions, or any combination thereof In some embodiments, floated process model parameters include more globally focused parameters for a given process, which is represented by the process simulation model. Examples of such floated process model parameters include vertical etch rate, lateral etch rate, nominal etch depth, etch selectivity, vertical deposition rate, plasma angular dependence of sputter yield, and plasma energy dependence of sputter yield, all for a given material subject to a given semiconductor device fabrication operation. Other examples of floated process model parameters include tilt angle of ion entry, twist angle of ion entry, visibility (e.g., into a feature) for etch and/or deposition, angular distribution (sometimes called source sigma), sticking coefficient (sometimes called isotropic ratio), sputter maximum yield angle, sputtering ratio, and etch ratio per crystal direction, again all for a given material subject to a given semiconductor device fabrication operation.

In various embodiments, the floated process model parameter combines any two or more of the process model parameters characterizing the substrate undergoing the semiconductor device fabrication operation. The combination may be a product or sum of the individual values of the parameters, either of which may be weighted based on the relative importance of the individual parameters to the predictive ability of the model or based on other factors. Sometimes, some or all values of the individual parameters are normalized prior to the combination. In some embodiments, the individual values are provided as separate contributions in the form of a vector. In one example, the combination of parameters can be the ion density and reaction rate with the materials on the surface. Without any other factors considered, the probability of removal would be proportional to the product of ion density, reaction rate, substrate material density, and surface area of original profile. As a result, ion density and reaction rate cannot be uniquely determined but their product can be. In some cases, the floated process model parameter does not have a known connection to particular physical and/or chemical processes of the device fabrication operation. Such floated process model parameters may be appropriate when optimizing behavioral process simulation models.

During an iterative optimization process, the value of a floated process model parameter, at any iteration, is deemed the "current value" of the floated process model parameter. The value of the parameter during a prior iteration might be called a prior value of the floated process model parameter, and the value of the parameter during a successive iteration might be called a successive value of the floated process model parameter. A modification of the value of a floated process model parameter from one iteration to the next is sometimes called an update of the current value of the floated process model parameter. At the end of the iterative optimization process, the value of the floated process model parameter is called the final value of the floated process model parameter.

To "optimize" a process simulation model, as used herein, is to improve the ability of the process simulation model to predict the result of a result of a semiconductor device fabrication operation that the model is designed to simulate. Often in the discussion herein, an optimization routine optimizes a process simulation model by iteratively adjusting the current value of one or more floated process model parameters. During optimization, a computationally predicted result of a process simulation model, which uses current value(s) of the floated process model parameter(s), may be compared with an experimentally determined result (e.g., a metrology result), with both the predicted result and the experimentally determined result being generated for the same semiconductor device fabrication operation. The comparison provides a cost value that reflects the magnitude of the difference (or agreement) between the predicted/simulation result and the experimentally determined result. The optimization routine uses the cost value to at least (i) determine whether the value(s) of the floated process model parameter value(s) have converged, and (ii) if the value(s) have not converged, determining how to adjust the current value(s) of the floated process model parameter(s) for the next iteration. In certain embodiments, the process uses not only the cost value of the current iteration, but the prior cost values of all or some of the historical iterations, to search for a global optimum.

To "compare" values of a computationally predicted result of a process simulation model and an experimentally determined result (e.g., a metrology result), as used herein, means to compare one or more features or indices of the two results. The comparison provides a cost value or values for the optimization process. Examples of differences (cost values) include L1 and L2 norms, a Euclidean distance, and Mahalanobis distance in multidimensional result space. As an example using results having multiple features or indices, the comparison may be done by extracting multiple indices to describe differences. As examples, these indices may be the critical dimension (CD) differences at multiple heights of a feature, process endpoint differences (e.g., differences in the endpoint of an etch process), thickness differences for a given material, or spectra differences within an entire spectra. These indices make up the cost function for optimization; the function may also be a combination of them, with weight factors for each. The cost function is sometimes referred to herein as a "difference," which should be interpreted more broadly than the simple mathematical operation A minus B.

The floated process model parameter values "converge," as used herein, when a process simulation model configured with them performs adequately for the application at hand. Various convergence criteria are known in the art and may be applied. Some of them are described below. Generally, cost values are evaluated in each iteration of an optimization routine. A cost value produced during a single iteration may be evaluated in isolation or in conjunction with cost values from other iterations. Such evaluation allows the optimization routine to conduct a convergence check. If the cost value or cost values indicate the current value of the floated process model parameter provides a process simulation model that performs acceptably and/or is no longer improving significantly, the optimization routine terminates the process and deems the current value of the floated process model parameter to be the final value. The optimization routine has converged. Thus, in certain embodiments, the convergence method determines when the error of parameter estimation (cost function) can no longer be improved. This allows a Bayesian view to the termination problem. The convergence check may search for local or global minimum in the cost value (or maximum depending on the structure of the cost value).

Optimization Process

Figure 3:
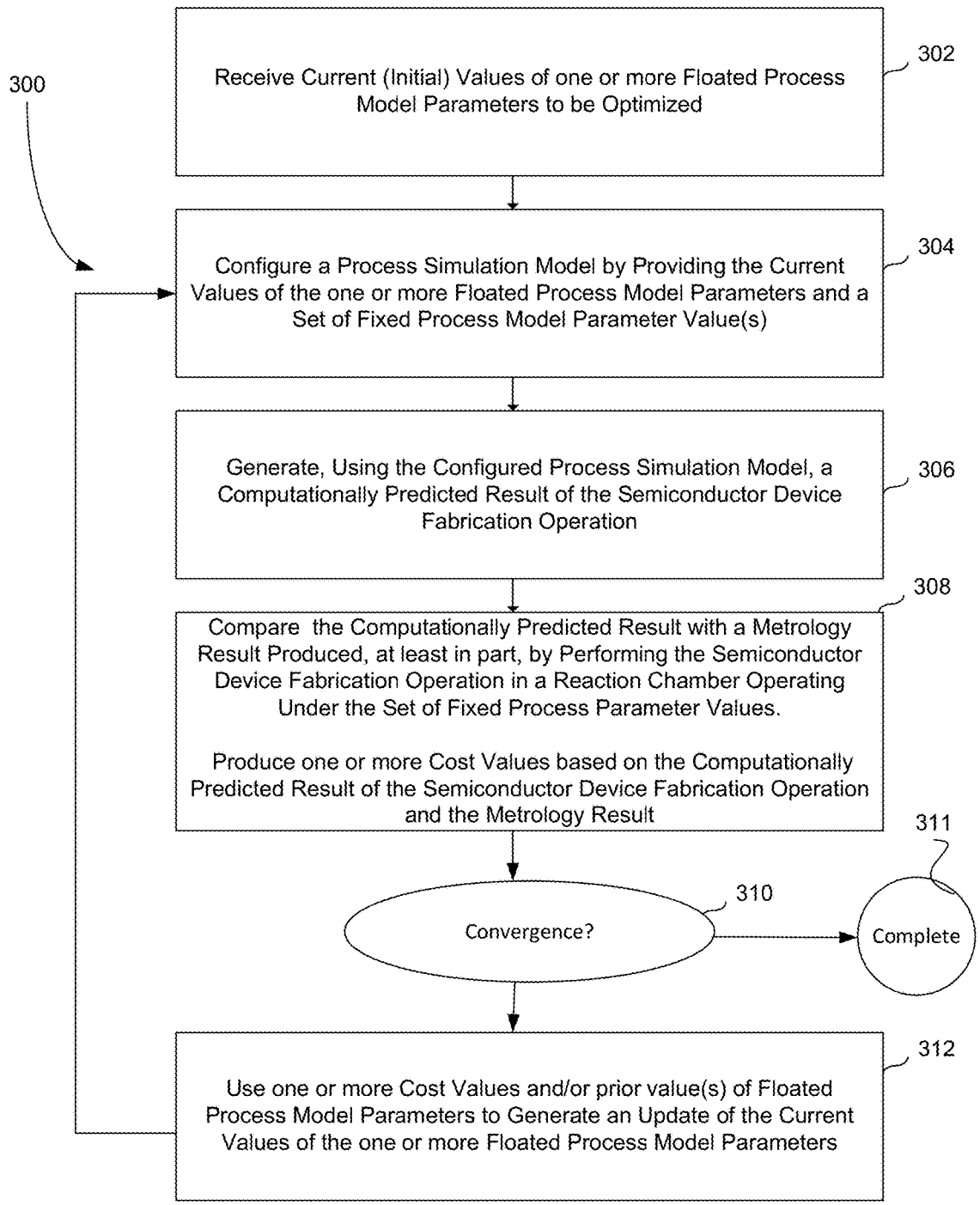
FIG. 3 shows an overview of a process that optimizes a process simulation model in accordance with certain embodiments.

FIG. 3 shows an overview of an optimization process 300 that optimizes a process simulation model in accordance with certain embodiments. The process simulated model is configured to predict a result of a semiconductor device fabrication operation using process parameter values characterizing a semiconductor device fabrication operation.

The methods may involve, at operation 302, receiving current values of one or more floated process model parameters to be optimized. In a first iteration, these current values may be considered initial values. A configured process simulation model is then produced, at operation 304, by providing to the process simulation model the current values of the one or more floated process model parameters, an input profile, and a set of fixed process model parameter value(s). A computationally predicted result of the semiconductor device fabrication operation is generated, at operation 306, using the configured process simulation model. The computationally predicted result of the semiconductor device fabrication operation is compared, at operation 308, with a metrology result produced, at least in part, by performing the semiconductor device fabrication operation in a reaction chamber operating under the set of fixed process parameter values, where the comparison produces one or more cost values based on a difference between the computationally predicted result of the semiconductor device fabrication operation and the metrology result. A convergence check is used, at operation 310, to determine whether the optimization process converged. If so, the process completes as indicated at 311. If not, the optimization process generates an update of the current value(s). See operation 312. The update may be produced using the cost value(s), the current values of the one or more floated process model parameter values and, optionally, one or more prior values of the floated process model parameter values At this point, process control returns to operation 304 with the update of the current values of the one or more floated process model parameters. Thereafter, operations 304, 306, 308, 310, and 312 are repeated until the current values of the one or more floated process model parameters converge to produce final values of the one or more floated process model parameters.

Figure 4:
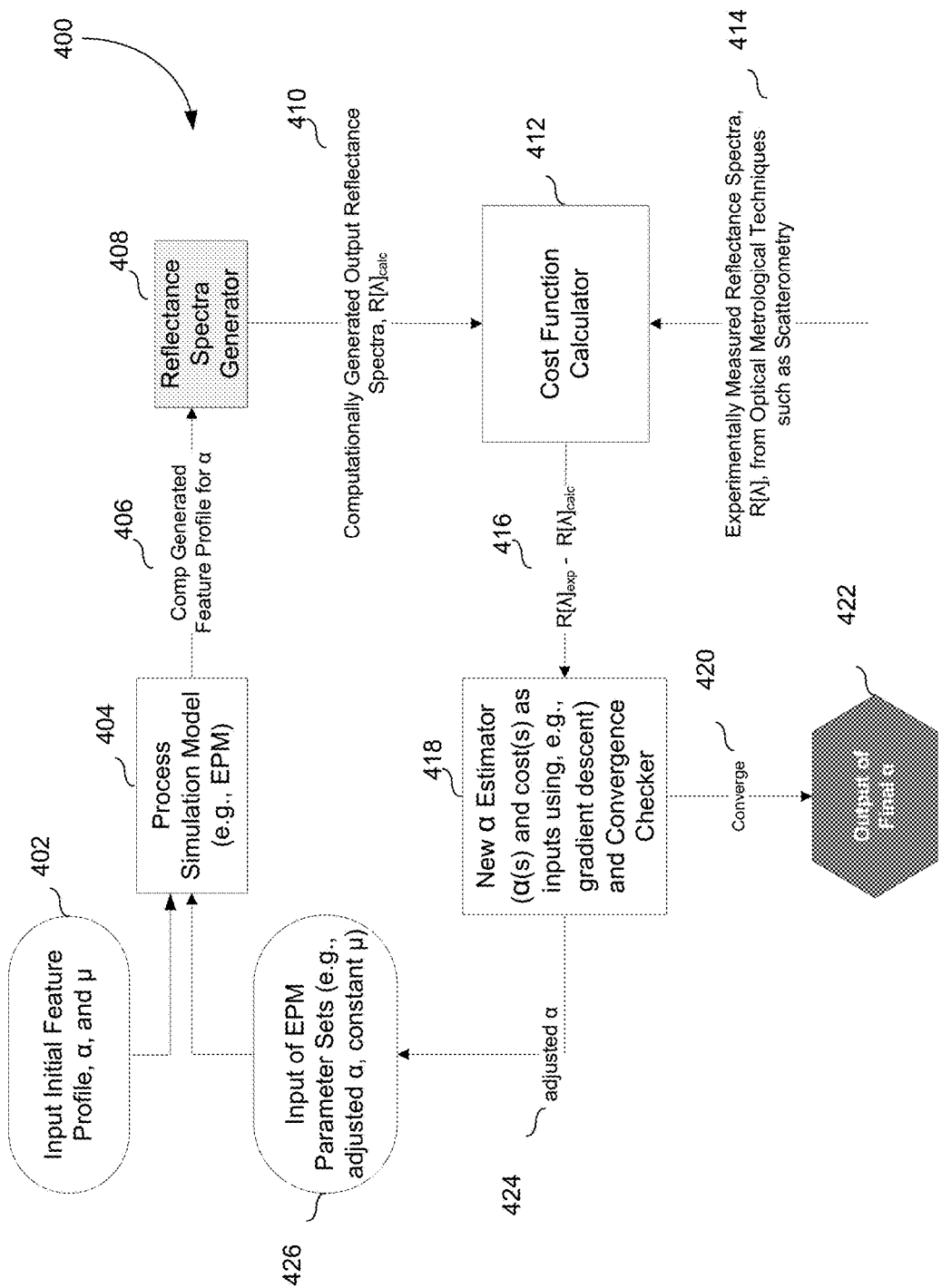
FIG. 4 shows an embodiment of an optimization system that employs a comparison of simulated and measured reflectance or ellipsometric values.

FIG. 4 shows an embodiment 400 of an optimization process that employs a comparison of simulated and measured reflectance or ellipsometric values. As indicated, to optimize a process simulation model for is to improve the ability of the process simulation model to predict the result of a semiconductor device fabrication operation that the model is designed to simulate, e.g., a computationally-generated feature profile. Iterative operation of optimization process 400 involves iteratively adjusting the current value of one or more floated process model parameters, $\alpha$.

In some embodiments, an initial feature profile, along with initial values of two types of process model parameters denoted in the figure by "$\alpha$" and "$\mu$" are input into a process simulation model, such as an etch profile model (EPM) discussed earlier. This input is illustrated by 402, and it begins the reflectance or ellipsometric comparison optimization process 400. The terms "initial profile," as introduced earlier, and "initial feature profile," as shown by 402, may be used interchangeably and refer to the spatial positions of points on a substrate surface that will be processed by a semiconductor device fabrication operation. For instance, the initial profile may have one or more features (or it may be fully planar), and it serves as the starting or input profile for the semiconductor device fabrication operation, which will then modify the initial profile. The process model parameter α represents one or more floated process model parameters to be optimized over the course of optimization process 300 and the fixed model parameters μ are process model parameters that are needed to execute the process simulation model but do not change over the course of the optimization procedure. The types of parameters used as the floated and fixed process model parameters need not be immutably set, e.g., local plasma properties such as ion flux may constitute a floated model parameter in some optimization embodiments, and may constitute a fixed model parameter in other optimization embodiments.

Next, a configured process simulation model 404, after providing the initial profile, and the initial values of parameters α and μ, executes. During execution, the model adjusts the input initial profile to an output profile in a manner intended to predict the result of a semiconductor device fabrication operation modeled by the process simulation model.

The execution of the process simulation model 404, and its attendant calculations and adjustments ultimately outputs a computationally-generated feature profile illustrated by 406. This profile is the model's prediction of the result of the semiconductor device fabrication operation under consideration. In the case of an etch process, the input feature profile may be a mask profile on a substrate, and the output computationally-generated feature profile may be an etch profile in the substrate under the mask openings. However, in cases where the process simulation model models a planarization process or an additive process, the output computationally-generated feature profile may be a profile of the substrate that reflects the planarization or additive process.

In some embodiments, a profile conditioner and/or a profile conditioning operation (not shown in FIG. 4) is performed on the computationally predicted result of the semiconductor device fabrication operation before another computational process that uses a feature profile; e.g., before a computational process that simulates reflection of electromagnetic radiation off of said computed etch profile is performed.

In the embodiments depicted in FIG. 4, operation of a profile conditioner, if employed, is conducted on the computationally-generated feature profile represented by 406. The profile conditioner, or profile conditioning operation smooths and/or otherwise reduces the effect of various non-periodic aberrations produced by the process simulation model in the predicted feature profile. These variations may be introduced by stochastic behavior of a process simulation model.

To accurately predict the reflectance pattern produced by providing incident electromagnetic radiation on an etch profile, which is the output 406 of the process simulation model, the optimization process employs a computational tool or algorithm such as Rigorous Coupled-Wave Analysis (RCWA) that assumes a certain periodicity of etched features, such as the feature and/or feature region, and further assumes material properties of the substrate material being etched and of the various gaps resultant from etching. Moreover, RCWA expects anticipated particular transition of a given material, i.e. a dielectric solid, to a different material, i.e. air, within an expected periodicity, i.e. generally defined in the art as the length-wise distance from analogous area of one feature region to the next.

The presence of non-periodic or stochastic aberrations in a feature may interfere with the proper operation of the RCWA method, such that the method may be unable to accurately predict a reflectance or ellipsometric spectrum produced when aberration is present.

The profile conditioner identifies and removes particular non-periodic structures from a feature. In some embodiments, the profile conditioner may determine whether to account for an aberration based on the height of the aberration.

For instance, the profile conditioner may be configured to identify and account for only aberrations exceeding a certain pre-specified height. In some embodiments, "micro-bumps," i.e. aberrations beneath the pre-specified height threshold are disregarded by the profile conditioner. Likewise, aberrations exceeding the pre-specified height threshold may be averaged or otherwise combined by the profile conditioner to create an average profile prior to application of RCWA to compute reflectance/ellipsometric spectra.

Returning to the embodiment FIG. 4, the computationally-generated feature profile is provided to a reflectance/ellipsometric spectra generator 408 to output a computationally-generated output reflectance/ellipsometric spectra, illustrated in the figure as "$R[\lambda]_{calc}$." The reflectance/ellipsometric spectra generator may be, for example, an algorithmic tool that implements RCWA or Finite Difference Time Domain (FDTD), both as described elsewhere herein.

The accuracy of the computationally-generated reflectance/ellipsometric spectra depends on the predictive power of the process simulation model as configured with the current value(s) of α. In the depicted process, the accuracy of the computationally-generated reflectance/ellipsometric spectra is determined by comparing them with experimentally measured results (e.g., metrology results), denoted as $R[\lambda]_{exp}$ that are generated from feature profiles of real substrates that have been processed according to the semiconductor device fabrication operation that is modeled by the process simulation model. Both the simulated and real fabrication operations use the same set of fixed process parameters and initial feature profile. The results of the real (non-computationally-generated) results may be obtained as experimentally-measured reflectance/ellipsometric spectra from optical metrological techniques, such as scatterometry and ellipsometry, as illustrated at 414 of optimization system 400. The computed and experimentally-generated results for be for the same detection technique (e.g., the same polarization, wavelength range, angle of incidence and detection, etc. for optical metrology) and same feature characteristic (e.g., CD at a particular depth, endpoint detection, deposited layer thickness, etc.).

The computationally predicted result $R[\lambda]_{calc}$, and metrology generated result $R[\lambda]_{exp}$ are compared (e.g., a difference, ratio, or other metric is determined) by a "cost function calculator" 412 to output one or more cost values, e.g., identified in the figure as $R[\lambda]_{exp} - R[\lambda]_{calc}$. This comparison provides cost value(s) that reflect the magnitude of the difference (or agreement) between the predicted/simulation result, e.g., $R[\lambda]_{calc}$, and the experimentally determined result, $R[\lambda]_{exp}$. Optimization system 400 uses the cost value(s) to at least (i) determine whether the value(s) of the floated process model parameter value(s) have converged, and (ii) if the value(s) have not converged, determining how, and to what extent, to adjust the current value(s) of the floated process model parameter(s) for the next iteration. As introduced earlier, one example of comparison results (cost values) is a simple Euclidean distance in multidimensional result space.

Estimator 418 employs a "convergence checker," which is an algorithm for evaluating potential convergence of the floated process model parameter value, α. In some embodiments, execution of the convergence checker or estimator 418 involves identifying a substantially local or global minimum in the one or more cost values and/or the amount of change in α over recent iterations. Upon determination of convergence of α, the convergence checker indicates this at 420, which leads to output of a final, or optimized, value of the floated process model parameter(s) α. As indicated earlier, an iterative modification of a floated process model parameter value from an initial or seed value, e.g., provided at 402, to a final value, e.g., output at 422, is a goal of the model optimization process conducted by optimization system 400. In some embodiments, iterative execution of an optimization process will result in a process simulation model configured with a final value of the floated process model parameter, which provides better predictive capability than a process simulation model configured with, for example, the initial value of the floated process model parameter.

Often, before meeting the final convergence criteria, during one or more iterations of the optimization routine, execution of the convergence checker 418 will indicate that the cost values have not reached a required convergence condition. In such instances, the convergence checker adjusts the current value of α and outputs an adjusted value of α as illustrated at 424. Adjusting α may employ, as understood by those of skill in the art, the current value of α and/or the cost value, as well as, optionally, one or more prior values of α and/or prior values the cost value. A gradient descent technique may be employed for this purpose. The adjusted α is then re-input, as illustrated at 426, while maintaining constant fixed process parameters, µ, in the process simulation model 404. In other words, the process simulation model is reconfigured with the adjusted value of α. The process simulation model then reexecutes with the same initial profile and same fixed process model parameters but adjusted floated process model parameters. The optimization system 400 then repeats operations of components 404 through 418, which may achieve the required convergence condition, or, if convergence is not achieved, repeats operations of components 404 through 426. However, the metrology results obtained at 414 may be reused in this new cycle. Through this cycle, optimization system 400 may further adjust α as needed. The optimize process continues for as many iterations as necessary to be able to output a final value of α, which corresponds to meeting a convergence condition for the cost value.

Figure 5:
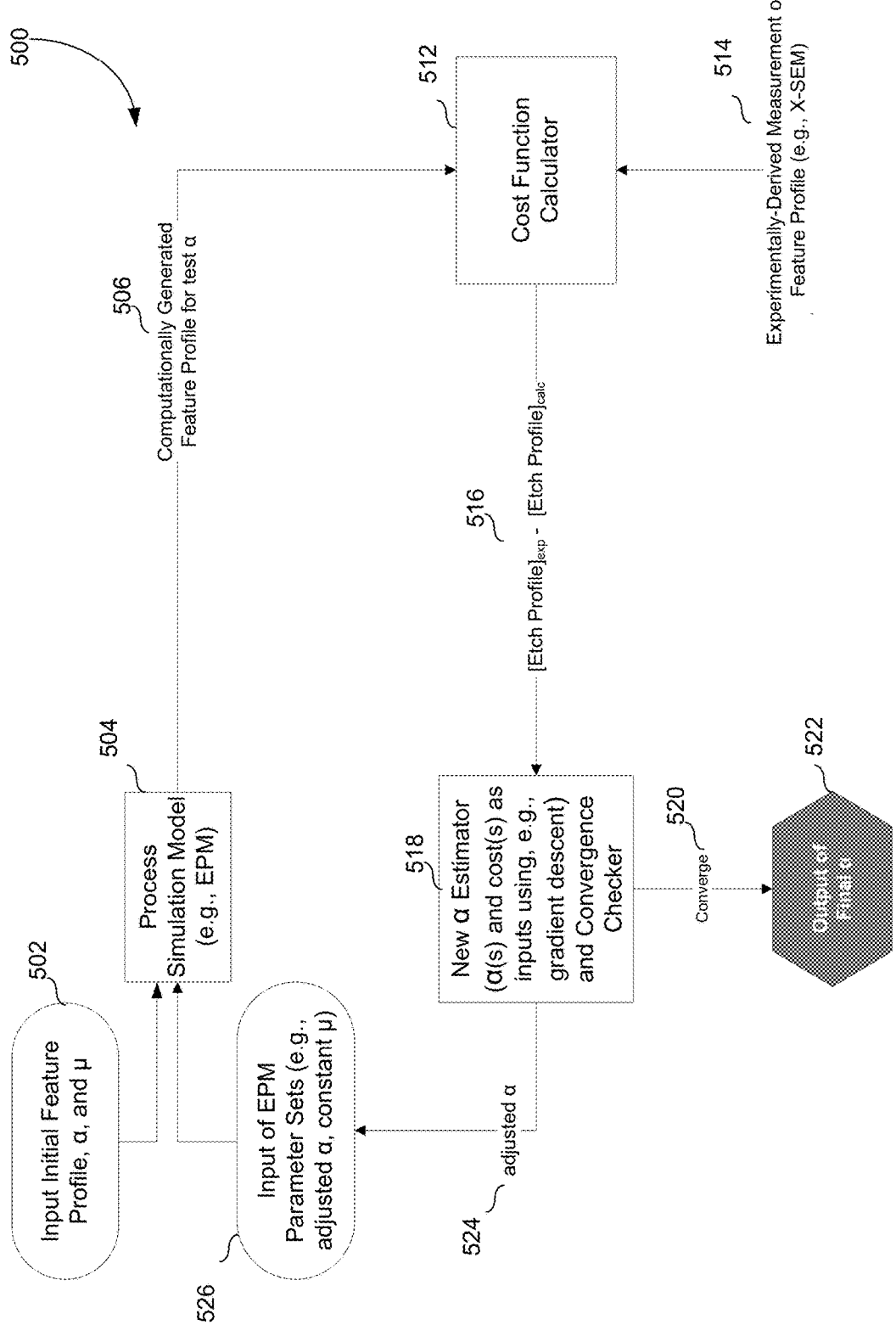
FIG. 5 shows an example of an optimization system that employs a comparison of simulated and measured feature profile values.

Referring now to FIG. 5, an example of an optimization routine 500 is shown. In contrast to the optimization system 400 shown earlier in FIG. 4 (which employs a comparison of reflectance/ellipsometric values), optimization system 500 shown here in FIG. 5 compares computationally-generated feature profile (for a given input α), illustrated as 506, against an experimentally-derived measurement of the feature profile, e.g. via energy dispersive X-ray Scanning Electron Microscopy ("X-SEM"), for example, to adjust α toward convergence as illustrated at 520. In this case, the process simulation model directly outputs a feature profile, and the process does not include the reflectance/ellipsometric spectra generator 408. Of course, if the process simulation model outputs information other than feature profiles, the method would require an appropriate converter to change the output to a profile.

Remaining system components and operations 502, 504, 506, 512, 516, 518, 520, 522, 524, and 526 of optimization process 500 are otherwise identical, or very similar, to earlier presented components and operations 402, 404, 406, 412, 416, 418, 420, 422, 424, and 426 of optimization process 400 and thus likewise also function to iteratively optimize the process model parameter α, representative of one or more floated process model parameters, while holding µ, representative of one or more fixed process model parameters, constant.

Also, similar to optimization conducted by system 400, the various types of parameters used as the floated and fixed process model parameters need not be immutably set, e.g., local plasma properties such as ion flux may constitute a floated model parameter in some optimization embodiments, and may constitute a fixed model parameter in other optimization embodiments.

In detail, optimization performed by system 500 begins at 502, which (similar to the optimization process of system 400) involves input of the initial feature profile, α and µ into a process simulation model, such as an etch profile model (EPM). The process simulation model 504 executes to adjust the input initial profile to an output profile, e.g., substantially identical or similar to that done by model 404, in a manner intended to predict the result of a semiconductor device fabrication operation (a feature profile in this case) modeled by the process simulation model. The execution of the process simulation model, and its attendant calculations and adjustments by model 504, ultimately outputs a computationally-generated feature profile illustrated by 506. As discussed earlier for optimization process 400, this profile is the process simulation model's prediction of the result of the semiconductor device fabrication operation under consideration.

However, unlike optimization system 400, optimization system 500 does not employ a reflectance/ellipsometric spectra generator (e.g., shown as 408 in optimization system 400), thus the computationally-generated feature profile 506 is provided directly to the cost function calculator 512, which also receives an experimentally derived measurement of the feature profile, e.g., obtained via X-SEM, as illustrated by 514. The experimentally derived measurement is obtained by processing a real substrate using the semiconductor device fabrication operation simulated by the process simulation model, and using the same initial substrate profile and fixed parameter values. As defined earlier, geometry of the feature profile, whether computationally-generated or experimentally derived, is a set of discrete points or parameters representing such points (e.g., a series of CD values at different elevations) in space representing the various positions of the particular feature, or a group of features. Note that there are many techniques available for experimentally determining the feature profile. Some techniques directly output profiles (e.g., SEM and AFM techniques) and others indirectly output the profiles (e.g., optical metrology techniques). In the latter case, the direct results (e.g., reflectance spectra) must be converted to feature profiles before they can be compared with the computationally-generated result.

Similar to execution of the cost function calculator 412 in optimization system 400, the cost function calculator 512 compares the computationally generated feature profile with the experimentally derived measurement of the feature profile to output one or more cost values, e.g. identified in the figure as [Etch Profile]$_{exp}$–[Etch Profile]$_{calc}$ (e.g., denoted as 516). This comparison provides cost value(s) that reflect the magnitude of the difference (or agreement) between the predicted/simulation result, e.g., [Etch Profile]$_{calc}$, and the experimentally determined result, [Etch Profile]$_{exp}$. And, identical or similar to optimization system 400, optimization system 500 uses the cost value(s) to at least (i) determine whether the value(s) of the floated process model parameter value(s) have converged, and (ii) if the value(s) have not converged, determining how, and to what extent, to adjust the current value(s) of the floated process model parameter(s) for the next iteration. Of course, the adjustment of the floated process model parameter(s) may employ other information such as current and former values of the floated process model parameter(s) and/or former values of the cost value(s).

Cost value(s) illustrated at 516 output by the cost function calculator 512 are provided to a convergence checker 518, which is an algorithm for evaluating potential convergence of $\alpha$ as indicated by the cost values. In some embodiments, and identical or similar to execution of the convergence checker 418 in optimization process 400, execution of the convergence checker 518 involves identifying a substantially local or global minimum in the one or more cost values. Upon indication of convergence of $\alpha$ by the convergence checker, the convergence checker determines that convergence has occurred as indicated at 520, which leads to output of a final, or optimized, floated process model parameter $\alpha$.

As indicated earlier, an iterative modification of a floated process model parameter value from an initial or seed value, e.g., provided at 502, to a final value, e.g., output at 522, is a goal of the model optimization process shown by optimization process 400. In some embodiments, iterative execution of an optimization process by system 400 will result in a process simulation model configured with a final value of the floated process model parameter, $\alpha$, which provides better predictive capability than a process simulation model configured with, for example, the initial value of the floated process model parameter.

And, identical or similar to execution of the convergence checker 418 of optimization system 400, before meeting the final convergence criteria, execution of the convergence checker 518 may indicate that the cost values have not reached a required convergence condition. In such instances, the convergence checker adjusts the current value of $\alpha$ and outputs an adjusted value of $\alpha$ as illustrated at 524. This adjusted $\alpha$ is then re-input, as illustrated at 526, while maintaining constant fixed process parameters, $\mu$, into the process simulation model 504. In other words, the process simulation model is reconfigured with the adjusted value of $\alpha$. The process simulation model then re-executes with the same initial profile and same fixed process model parameters but adjusted floated process model parameters. The optimization system 500 then repeats operations performed via components 502 through 526, as before, although the experimentally measured profile obtained at 514 may be reused in this new cycle. Through this cycle optimization, system 500 may further adjust a as needed. The optimization continues for as many iterations as necessary to be able to output a final converged value of $\alpha$ at 522.

Figure 6:
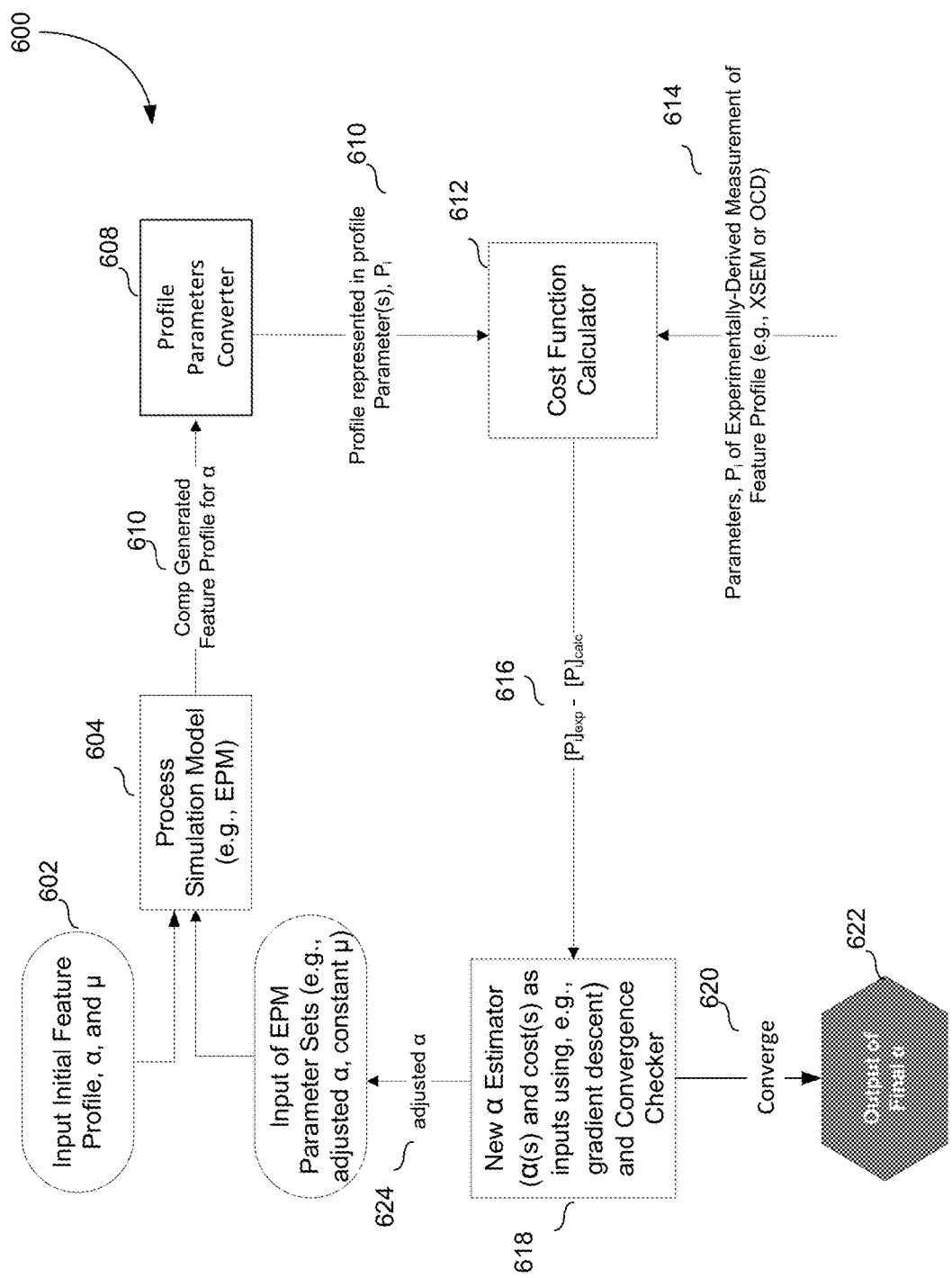
FIG. 6 shows an example of an optimization system that employs a set of "profile parameters" to represent the geometry of the feature profile, e.g., potentially using fewer data points, or sets thereof.

Referring now to FIG. 6, an optimization system 600 is shown. In contrast to the embodiment employing system 400 shown in FIG. 4 (which employs a comparison of reflectance/ellipsometric values), optimization system 600 shown in FIG. 6 does not include the reflectance/ellipsometric spectra generator 408, but rather includes a profile parameters converter 608. Remaining operations of components 602 through 624 of optimization process 600 are somewhat similar, to corresponding operations of components 402 through 424, corresponding to optimization system 400 shown in FIGS. 4. A redundant description of the same is omitted.

As explained earlier, a result of executing a process simulation model may be a profile of the substrate after (or during) a semiconductor device fabrication operation simulated by the model. Such profile may be represented as a set of discrete points in space representing the various positions within and/or near a particular feature, or a group of features.

In optimization process of system 600, and in contrast to using a profile of the substrate defined by a set of points in space, the process employs a set of "profile parameters" to represent the geometry of the feature profile, e.g., potentially using fewer data points, or sets thereof. That is, the process simulation model 604, e.g., EPM, outputs a computationally-generated feature profile that may have a multitude of discrete points in space as described above. Such points are then systematically reduced, or at least partially eliminated, by the "profile parameters converter" 608 to output what may be referred to as a "parsimonious" profile, e.g., the profile represented in profile parameter(s), $P_i$, as illustrated at 610. Examples of profile parameters include these characteristics of a feature or group of features: critical dimension, sidewall angle, depth, pitch, and the like. Techniques for converting a feature profile to a set of profile parameters are known in the art and commonly used on Optical Critical Dimension methods.

Similar to optimization processes 400 and 500 described earlier, a cost function calculator 612 of optimization system 600 receives geometric profile parameters $P_i$, which are derived from experimentally-generated data such as X-SEM or optical metrology. These profile parameters may be derived from such experimentally-generated data using OCD methods. The result is a geometric characterization of the feature with parameters characterizing different aspects of a geometric model such as a trapezoidal model or a corner rounding model. Cost function calculator 612 also receives the profile parameters from the profile parameters converter 608. Using these inputs, the cost function calculator 612 outputs one or more cost values thereof, e.g. $[P_i]_{exp}-[P_i]_{calc}$, 616. Such cost values are likewise received and used by the convergence checker 618 as discussed earlier for the convergence checker 418 and/or 518 to iteratively adjust $\alpha$ as needed to ultimately achieve convergence, as illustrated at 620, and output final $\alpha$ as illustrated at 622.

In certain embodiments, the systems being simulated and experimentally evaluated via metrology have multi-layer stacks of deposited material, including optionally, a mask layer. A process simulation model that is calibrated using multilayer stacks comprising layers of varying thicknesses and optionally varying materials can have great practical value. Commonly etch processes are performed on multi-layer stacks of heterogeneous materials. However, when calibrating a process simulation model using substrates having multilayer stacks of material to be etched, it is important that the simulation model use correct thickness values for each of the layers in the stack. To this end, the methods described herein may be performed in a manner in which a physical substrate comprising a multilayer stack to be used in calibration is evaluated by metrology preliminarily to determine the thickness of each layer in the stack. These thicknesses are then used in the computational representation of the substrate considered in the process simulation model. In this manner, the simulation appropriately represents the physical structure that will be used to provide experimental information, obtained by metrology, for calibrating the process simulation model.

In some embodiments, after the process simulation model has been fully calibrated (e.g., the value of alpha has converged to a point where the model can be used confidently), the model is put into practice and used for predicting etch results and all the applications that are associated with that (e.g., defining lithography masks, designing new etch apparatus, specifying in etch process window, and the like). If, during actual use of such process simulation model, it is discovered that the model has failed to accurately predict the etch profile produced by a real etch process, such information can be employed to further calibrate or at least refine the calibration of the model. The simulation result for the conditions resulting in the erroneous prediction are provided to the optimization routine along with the actual results of the etch process in order to further optimize the parameter values (alpha) used in the process simulation model. In this manner, the predictive capability of the process simulation model may be improved within the realm of physical conditions in which it is used, and/or the realm of the model is extended to new physical applications represented by the etch conditions for which the model incorrectly predicted an etch result. Of course, over the life of the process simulation model, this recalibration may be employed multiple times, i.e., whenever a failed ability to predict is discovered.

Etch Profile Models

As mentioned, etch profile models (EPMs) are a type of process simulation model. They compute a theoretically determined etch profile from a set of input etch reaction parameters (independent variables) characterizing some features of the etch reaction such as certain underlying physical and chemical etch processes and reaction mechanisms. These processes may be modelled as a function of time and location in a grid representing features being etched and their surroundings. Examples of input parameters include plasma parameters such as ion flux and chemical reaction parameters such as the probability that a particular chemical reaction will occur. Other examples, include characteristics of the substrate being etched (e.g., a layer-by-layer description of thicknesses and materials), an initial mask layout for one or more features to be etched, process chamber conditions, and the like. Such parameters may be obtained from various sources, including other models which calculate them from general reactor configurations and process conditions such as pressure, substrate temperature, plasma source parameters (e.g., power, frequencies, duty cycles provided to the plasma source), reactants, and their flow rates. In some embodiments, such models may be part of the EPM.

EPMs take such parameters as independent variables (which may be fixed and/or floated in the context of the optimization routines described herein) and functionally generate etch profiles as response variables. In other words, a set of independent variables are the parameters used as inputs to the model, and response variables are the etch profile features calculated by the model. The EPMs may employ one or more relationships between the reaction parameters and the etch profile. The relationships may include, e.g., coefficients, weightings, and/or other model parameters (as well as linear functions of, second and higher order polynomial functions of, etc. the reaction parameters and/or other model parameters) that are applied to the independent variables in a defined manner to generate the response variables, which are related to the etch profiles. Such weightings, coefficients, etc. may represent one or more of the reaction parameters described above. In some embodiments, these model parameters are the floated process model parameter values that are tuned or adjusted during the optimization techniques described herein. In some embodiments, some of the reaction parameters are model parameters to be optimized, while others are used as fixed process model parameters. For example, in some embodiments, chemical reaction parameters may be optimizable floated process model parameters, while plasma parameters may be fixed process model parameters.

As explained, some EPMs employ fundamental reaction mechanistic parameters and may be viewed as fundamental to the underlying chemistry and physics and therefore the experimental process engineer generally does not have control over these quantities. In the etch profile model, these variables may be applied at each location of a grid and at multiple times, separated by defined time steps. In some implementations, the grid resolution may vary between about a few Angstroms and about a micrometer. In some implementations employing time dependent modelling, the time steps may vary between about 1e-15 and 1e-10 seconds. In certain embodiments, the optimization employs two types of mechanistic independent variables: (1) local plasma parameters, and, and (2) local chemical reaction parameters. These parameters are "local" in the sense that they may vary a function of position, in some cases down to the resolution of the grid. Examples of the plasma parameters include local plasma properties such as fluxes and energies of particles such ions, radicals, photons, electrons, excited species, depositor species and their energy and angular distributions etc. Examples of chemical and physico-chemical reaction parameters include rate constants (e.g., probabilities that a particular chemical reaction will occur at a particular time), sticking coefficients, energy threshold for etch, reference energy, exponent of energy to define sputter yields, angular yield functions and its parameters, etc. Further, the parameterized chemical reactions may include reactions in which the reactants include the material being etched and an etchant. It should be understood that the chemical reaction parameters may include various types of reactions in addition to the reactions that directly etch the substrate. Examples of such reactions include side reactions, including parasitic reactions, deposition reactions, reactions of by-products, etc. Any of these might affect the overall etch rate. It should also be understood that the model may require other input parameters, in addition to the above-mentioned plasma and chemical reaction input parameters. Examples of such other parameters include the temperature at the reaction sites, the partial pressure or reactants, etc. In some cases, these and/or other non-mechanistic parameters may be input in a module that outputs some of the mechanistic parameters. In some embodiments, models do not employ mechanistic parameters, at least not directly.

Initial (unoptimized) values for the EPM model variables, as well as variables that are fixed during optimization (e.g., the plasma parameters in some embodiments) may be obtained from various sources such as the literature, calculations by other computational modules or models, etc. In some embodiments, the independent input variables—such as the plasma parameters—may be determined by using a model such as, for the case of the plasma parameters, from an etch chamber plasma model. Such models may calculate the applicable input EPM parameters from various process parameters over which the process engineer does have control (e.g., by turning a knob)—e.g., chamber environment parameters such as pressure, flow rate, plasma power, wafer temperature, ICP coil currents, bias voltages/ power, pulsing frequency, pulse duty cycle, and the like.

EPMs may take any of many different forms. Ultimately, they provide a relationship between the independent and response variables. The relationship may be linear or non-linear. In certain embodiments, an EPM is what is referred to in the art as a cell-based Monte Carlo surface reaction model. These models, in there various forms, operate to simulate a wafer feature's topographical evolution over time in the context of semiconductor wafer fabrication. The models launch pseudo-particles with energy and angular distributions produced by a plasma model or experimental diagnostics for arbitrary radial locations on the wafer. The pseudo-particles are statistically weighted to represent the fluxes of radicals and ions to the surface. The models address various surface reaction mechanisms resulting in etching, sputtering, mixing, and deposition on the surface to predict profile evolution. During a Monte Carlo integration, the trajectories of various ion and neutral pseudo-particles are tracked within a wafer feature until they either react or leave the computational domain. The EPM has advanced capabilities for predicting etching, stripping, atomic layer etching, ionized metal physical vapor deposition, and plasma enhanced chemical vapor deposition on various materials.

In some embodiments, an EPM utilizes a rectilinear mesh in two or three dimensions, the mesh having a fine enough resolution to adequately address/model the dimensions of the wafer feature (although, in principle, the mesh (whether 2D or 3D) could utilize non-rectilinear coordinates as well). The mesh may be viewed as an array of grid-points in two or three dimensions. It may also be viewed as an array of cells which represent the local area in 2D, or volume in 3D, associated with (centered at) each grid-point. Each cell within the mesh may represent a different solid material or a mixture of materials. Whether a 2D or 3D mesh is chosen as a basis for the modeling may depend on the class/type of substrate feature being modelled. For instance, a 2D mesh may be used to model a long trench feature (e.g., in a polysilicon substrate), the 2D mesh delineating the trench's cross-sectional shape under the assumption that the geometry of the ends of the trench are not too relevant to the reactive processes taking place down the majority of the trench's length away from its ends (i.e., for purposes of this cross-sectional 2D model, the trench is assumed infinite, again a reasonable assumption for a trench feature away from its ends). On the other hand, it may be appropriate to model a circular via feature (a through-silicon via (TSV)) using a 3D mesh (since the x,y horizontal dimensions of the feature are on par with each other).

Mesh spacing may range from, e.g., sub-nanometer (e.g., from 1 Angstrom) up to several micrometers (e.g., 10 micrometers). Generally, each mesh cell is assigned a material identity, for example, photoresists, polysilicon, gaseous etchant or plasma (e.g., in the spatial region not occupied by the feature), which may change during the profile evolution. Solid phase species may be represented by the identity of the material in a computational cell; gas phase species may be represented by computational pseudo-particles. In this manner, the mesh provides a reasonably detailed representation (e.g., for computational purposes) of the substrate feature and surrounding gas environment (e.g., plasma) as the geometry/topology of the wafer feature evolves over time in a reactive etch process.

Some of the foregoing description has focused on process simulation models, such as surface kinetic models, that employ a mechanistic representation of a semiconductor device fabrication operation. Such models are described in more detail in US Patent Application Publication No. 20217022482, filed Feb. 8, 2016 and US Patent Application Publication No. 20170363950, filed Jun. 21, 2016, both incorporated herein by reference in its entirety. However, certain embodiments use quite different models to represent semiconductor device fabrication operations. In some cases, models do not employ mechanistic parameters that attempt to explain the underlying chemistry or physics of a semiconductor device fabrication operation, at least not directly. For example, behavioral models may employ abstractions of processes to predict structural details of features produced by one or more semiconductor device fabrication operations. One example of a behavioral model is the SEMulator3D™ from Coventor, a Lam Research Company. Examples of behavioral models are presented in U.S. Pat. Nos. 9,015,016 and 9,659,126, both previously incorporated by reference.

In various embodiments, process simulation models described herein model a feature in three dimensions. In some cases, process simulation models described herein predict the impact of a semiconductor device fabrication operation on not just one feature but on a group of features over an area of a design layout (e.g., over large, multi-device areas).

While the foregoing description has focused on etch models, this disclosure also pertains to other models such as models for predicting the effect of a planarization process or a deposition process on a substrate.

Experiments and Profile Measurements

To optimize process simulation models, various experiments may be performed in order to determine—as accurately as the experiments allow—the actual profiles which result from actual processes performed under the various process conditions as specified by various sets of process parameters. Thus, for instance, one specifies a first set of values for a set of process parameters—such as etchant flow rate, plasma power, temperature, pressure, etc.—sets up the chamber apparatus accordingly, flows etchant into the chamber, strikes the plasma, etc., and proceeds with the processing of the first semiconductor substrate to generate a first profile. One then specifies a second set of values for the same set of process parameters, processes a second substrate to generate a second profile, and so forth.

Various combinations of process parameters may be used to present a broad or focused process space, as appropriate, to optimize the process simulation model. The same combinations of process parameters are then used to calculate (independent) input parameters, such as the mechanistic parameters, by the process simulation model to provide profile outputs (response variables) that can be compared against the experimental results. Because experimentation can be costly and time consuming, techniques can be employed to design experiments in a way that reduces the number of experiments that need be conducted to provide a robust training set for optimizing the process simulation model. Techniques such as design of experiments (DOE) may be employed for this purpose. Generally, such techniques determine which sets of process parameters to use in various experiments. They choose the combinations of process parameters by considering statistical interactions between process parameters, randomization, and the like. As an example, DOE may identify a small number of experiments covering a limited range of parameters around the center point of a process that has been finalized.

In some approaches, a researcher will conduct all experiments early in the model optimization process and use only those experiments in the optimization routine iterations until convergence. Alternatively, an experiment designer may conduct some experiments for early iterations of the optimization and additional experiments later as the optimization proceeds. The optimization process may inform the experiment designer of particular parameters to be evaluated and hence particular experiments to be run for later iterations.

One or more in situ or offline metrology tools may be used to measure the experimentally-generated profiles which result from these experimental process operations. Measurements may be made at the end of the processes, during the processes, or at one or more times during the processes. When measurements are made at the end of a process, the measurement methodology may be destructive, when made at intervals during the etch process, the measurement methodology would generally be non-destructive (so not to disrupt the etch). Examples of appropriate metrology techniques include, but not limited to, in-situ reflectometry, OCD, cross-sectional SEM, and others mentioned above. Note that a metrology tool may directly measure a feature's profile, such as is the case of SEM (wherein the experiment basically images a feature's etch profile), or it may indirectly determine a feature's etch profile, such as in the case of OCD measurements (where some post-processing is done to back-out the feature's etch profile from the actual measured data). Metrology techniques may be categorized by where they are conducted and what they do to the sample; categories include in-situ, offline nondestructive, and destructive metrology. In situ metrology includes, for example, reflectometry and ellipsometry; offline nondestructive metrology includes, for example, single-wavelength and broadband OCD metrology or scatterometry, dome scatterometry, CD-SAXS, and CD-SEM (top-down SEM); and destructive metrology includes, for example, X-SEM, STEM, and TEM.

In any event, the result of the experiments and metrology procedures is a set of measured profiles, each generally including a series of values for a series of coordinates or a set of grid values which represent the shape of the feature's profile as described above. The profiles are then be used as inputs to train, optimize, and improve the computerized etch profile models as described herein.

Reflectometry and Ellipsometry Spectra Analytical and Modelling Tools

When using a process simulation model to generate the feature profile values, the optical parameters generated from the geometry may be modeled or predicted using an optical modeling routine such as the RCWA method or similar technique.

RCWA is but one method that can be used to describe the characteristics of reflected (diffracted, scattered) radiation from a periodic structure such as a grating, or transmitted through such a grating. RCWA was largely developed by Moharam and Gaylord and described in the scientific literature. See e.g., M. G. Moharam and T. K. Gaylord "Rigorous coupled-wave analysis of planar-grating diffraction" J. Opt Soc of America, Vol. 71, Issue 7, pp. 811-818 (1981), incorporated herein by reference in its entirety. RCWA calculates the intensity and polarization characteristics of the various diffracted orders (zeroth order and higher orders). Other optical modelling methods that can provide results include, but are not limited to, C method, Modal method, Rayleigh approximation, EFIE (e-field integration equation), and Cf-FFT (conjugate gradient-fast fourier transform).

RCWA is a semi-analytical method in computational electromagnetics that is often employed to solve scattering from periodic dielectric structures. It is a Fourier-space method so devices and fields are represented as a sum of spatial harmonics. The method is based on Floquet's theorem that the solutions of periodic differential equations can be expanded with Floquet functions (or sometimes referred as Block wave, especially in solid-state physics). A device is divided into layers that are each uniform in the z direction. A staircase approximation is needed for curved devices with properties such as dielectric permittivity graded along the z-direction. The electromagnetic modes in each layer are calculated and analytically propagated through the layers. The overall problem is solved by matching boundary conditions at each of the interfaces between the layers using a technique like scattering matrices. To solve for the electromagnetic modes, which are decided by the wave vector of the incident plane wave, in periodic dielectric medium, Maxwell's equations (in partial differential form) as well as the boundary conditions are expanded by the Floquet functions and turned into infinitely large algebraic equations. With the cutting off of higher order Floquet functions, depending on the accuracy and convergence speed one needs, the infinitely large algebraic equations become finite and thus solvable by computers.

Another way to computationally generate optical parameters produced (or producible by) optical beam interaction with substrate features is by using a finite-difference time-domain (FDTD) method. This is a numerical analysis technique for modelling electrodynamics. It is a grid-based finite difference method for finding approximate solutions to the time-dependent Maxwell's equations in partial differential form. The equations are discretized in time and space partial derivatives. The resulting finite-difference equations are solved in a leapfrog manner: the electric field vector components in volume space are solved at a given instant in time, and then the magnetic field vector components in the same spatial volume are solved at the next instant in time, and the process is repeated until the desired transient or steady-state electromagnetic field is calculated.

Convergence Checking

The floated process model parameter optimization procedure described above may be an iterative non-linear optimization procedure—e.g., it optimizes an error metric or cost value that is, in general, a non-linear function of the input parameters—and, as such, various techniques known in the art for non-linear optimization may be employed. See, for example: Biggs, M. C., "Constrained Minimization Using Recursive Quadratic Programming," Towards Global Optimization (L. C. W. Dixon and G. P. Szergo, eds.), North-Holland, pp 341-349, (1975); Conn, N. R., N. I. M. Gould, and Ph.L. Toint, "Trust-Region Methods," MPS/SIAM Series on Optimization, SIAM and MPS (2000); Moré, J. J. and D. C. Sorensen, "Computing a Trust Region Step," SIAM Journal on Scientific and Statistical Computing, Vol. 3, pp 553-572, (1983); Byrd, R. H., R. B. Schnabel, and G. A. Shultz, "Approximate Solution of the Trust Region Problem by Minimization over Two-Dimensional Subspaces," Mathematical Programming, Vol. 40, pp 247-263 (1988); Dennis, J. E., Jr., "Nonlinear least-squares," State of the Art in Numerical Analysis ed. D. Jacobs, Academic Press, pp 269-312 (1977); Moré, J. J., "The Levenberg-Marquardt Algorithm: Implementation and Theory," Numerical Analysis, ed. G. A. Watson, Lecture Notes in Mathematics 630, Springer Verlag, pp 105-116 (1977); Powell, M. J. D., "A Fast Algorithm for Nonlinearly Constrained Optimization Calculations," Numerical Analysis, G. A. Watson ed., Lecture Notes in Mathematics, Springer Verlag, Vol. 630 (1978); each of which is hereby incorporated by reference in its entirety.

In general, the comparison used to calculate cost compares multiple aspects or indices of the computationally predicted and metrology results. The differences between computationally generated and measured values of these indices make up the cost function for optimization. Examples of the indices include the critical dimension (CD) differences for multiple heights of a material, thickness differences for a given material, and spectra differences of the entire spectra. The cost function may be a combination of them, optionally with weight factors for each. The differences may be expressed as the L1 or L2 norm, a Euclidean distance, a Mahalanobis distance, etc. In some embodiments, these techniques optimize an objective function (here the cost function/value) subject to certain constraints which may be placed on the input parameters and/or the error metric. In certain such embodiments, the constraint functions themselves may be non-linear. For example, in embodiments where the computed etch profile is represented with a set of stacked trapezoids which are output by the process simulation model, the cost value may be defined as the difference between the area represented by the boundaries of these stacked trapezoids and the area of the measured experimental etch profile. In this case, the error metric is a non-linear function of the response variables output by the process simulation model, and thus a constrained optimization technique is selected from those just described (and/or from the incorporated references) which allows for the specification of non-linear constraints.

Applications of Optimized Process Simulation Models

The optimized computerized etch models disclosed herein may be useful in semiconductor processing workflows wherever a detailed assessment and characterization of an etch process is desirable. For instance, if a new etch process is being developed, the model may be used to determine etch profile characteristics for many combinations of process parameters without having to go into the lab and perform each experiment individually. In this way, the optimized etch profile models may enable quicker process development cycles, and in some embodiments may significantly reduce the amount of work required to fine tune a target profile.

Lithographic operations and mask development may also benefit greatly from accurate etch profile modeling because estimating edge placement error is typically quite important in lithographic work, and an accurate calculation of profile shape provides that information.

U.S. patent application Ser. No. 15/367,060, filed Dec. 1, 2016, which is incorporated herein by reference in its entirety, describes edge placement error detection and lithographic mask design. Note that there are at least two levels of design layout correction that may be applicable in this context: lithography and etch. In other words, both optical and etch-based considerations may be used to determine a mask layout. The etch-based considerations are determined using a model prepared as described herein.

To manufacture a photolithography mask using a layout determine as described herein, a process begins with a so-called blank that includes a glass substrate coated with a chrome layer and a resist layer. Sometimes a material other chrome or in addition to chrome is used. For example, attenuated phase shift masks use an additional layer such as a molybdenum silicide layer. The resist may be a positive or negative resist. Upon electron beam exposure, a pattern formed is formed on the resist that can be transferred into the underlying chrome layer via an etch process. The chrome provides opaque areas on the photolithography mask which cast shadows during exposure of semiconductor wafers.

The manufacturing of photolithography masks is similar lithography steps during semiconductor device manufacture. However, the exposure of the resist which is done by electron beams as opposed to light (e.g., deep UV). The blank is exposed to electron beam radiation that impinges on the resist in locations specified by the mask design layout, which is determined at least in part using an EPM of a type described herein. Subsequently, the mask is developed to produce the pattern of the layout. The now formed resist pattern is then transferred to the underlying chrome by an appropriate etch process (e.g., plasma or wet etching). Thereafter, the resist is removed and the exposed chrome pattern is covered with a pellicle to prevent contamination.

The optimized models disclosed herein may also be useful for solving the reciprocal problem: where one desires a specific target etch profile and wants to discover one or more specific combinations of process parameters (or EPM input parameters) for achieving it. Again, this could be done by experimental trial and error, but an accurate modeling of the etch profile that results from a given set of process parameters (or EPM input parameters) and conditions can replace the need for experimentation, or at least do so in the initial phases of exploring the process/input parameter space, until good candidates may be identified for full experimental study. In some embodiments, it may be possible to, in effect, numerically invert the model—i.e., iteratively locate a set of parameters which generate a given etch profile—in a fully automated fashion. Once again, dimensionality reduction of the etch profile coordinate space (via PCA), and projection of the desired etch profile onto this space, may make this numerical inversion more feasible.

Based on the disclosure provided herein, the EPM may be used to facilitate process window and hardware optimizations. In some embodiments, the EPM is used to determine a parameter set (e.g., a process window) for an existing reactor or reactor design, which is not modified. In some embodiments, the EPM is used to determine a modified reactor design including, but not limited to, components of the reactor. For example, the EPM may suggest a shower head design modification (e.g., the hole pattern or internal flow lines are changed from an existing design). In other example, the EPM may suggest a plasma generator design modification (e.g., the configuration and/or placement of a capacitively coupled plasma ("CCP") electrode or an inductively coupled plasma ("ICP") coil is changed from an existing design). In one example, the EPM may suggest a change to the design or location of a wafer pedestal. In yet another example, the EPM may suggest a change to the position or shape of chamber walls. A general description of CCP and ICP reactors is found in US Patent Application Publication No. 20170363950, filed Jun. 21, 2016, and incorporated herein by reference in its entirety.

In certain embodiments, an optimized EPM may be integrated with an etcher apparatus or into the infrastructure of a semiconductor fabrication facility which deploys one or more etcher apparatuses. The optimized EPM may be used to determine appropriate adjustments to process parameters to provide a desired etch profile or to understand the effect of a change in process parameters on the etch profile. Thus, for instance, a system for processing semiconductor substrates within a fabrication facility may include an etcher apparatus for etching semiconductor substrates whose operation is adjusted by a set of independent input parameters which are controlled by a controller which implements an optimized EPM. A suitable controller for controlling the operation of the etcher apparatus typically includes a processor and a memory, the memory storing the optimized EPM, and the processor using the stored EPM to compute etched feature profiles for a given set of values of a set of input process parameters. After computing a profile, in some embodiments, the controller may (in response to the shape of the computed profile) adjust the operation of the etcher apparatus by varying one or more values of the set of independent input parameters.

In some implementations, the model is used for monitoring and processing in situ optical signals, in real time, to generate a geometric etch parameter from the in situ optical information (e.g., real time end point or critical dimension monitoring). Such in situ monitoring and processing capability may be provided in any of various reactor configurations (e.g., capacitively coupled plasma reactors and inductively coupled plasma reactors). In certain embodiments, a feature characterization process (e.g., end point assessment) completes processing in about 100 ms or less (from the time it receives input variable values such as optical measurements). In certain embodiments, the feature characterization algorithm completes processing in about 20 ms or less. Such rapid processing may be employed, for example, in applications with critical step change requirements or in high etch rate processes (e.g., etch processes that complete in less than about a minute). In processes with many variations induced by the processing regime (such as in RF pulsing or gas pulsing) or when the wafer structure itself has a complicated structure (such as in stacks of alternating materials), data arrays (e.g., thousands of them) may be required, sometimes for each of multiple time samples (e.g., one hundred or more, or one thousand or more). The model's execution time also depends on the type of algorithm used. In some implementations the model processes all or much of the time evolution of the spectral information from the beginning of the etch process to the current time. This may require large number of models being created such as with multiway principal component analysis (PCA) and multiway partial least squares (PLS), where each model compares the optical measurement trajectories from the beginning of the etch until the current time step with respect to historical trajectories of corresponding time intervals. Such models may have increased computational requirements both during model calibration and during real-time process monitoring as the etch time gets longer. In such cases, the system may be configured with additional processing capabilities such as processors with large amounts of buffer space, multithreading, and/or multiple cores.

In certain embodiments, the model uses an optical output signal over only a limited range of wavelengths (or other aspect of the optical signal), which may be selected for determining the geometric parameter of interest. The signal in this range is used as an independent variable (or a group of independent variables) for the model. In some such implementations, much of the available optical signal is not used as an input. The selected range may represent a small fraction (e.g., less than about 10% or even a discrete value) of the full range of values that can be measured by the metrology tool. Using a selected range as a model input can require less computation, and therefore faster calculation, to determine an etch feature's geometry. It can also allow selected dependent variables to be calculated without interference from correlated geometric parameters; for example, etch depth can be calculated without significant interference from input signals that strongly correlate with critical dimension. For example, a first wavelength range may strongly correlate with etch depth, while a different wavelength range may strongly correlate with critical dimension but only weakly correlate with etch depth. A process focusing on etch depth may, to avoid obscuring signal, use only optical signals in the first wavelength range.

Generally, an etcher apparatus which may be used with the disclosed optimized EPMs may be any sort of semiconductor processing apparatus suitable for etching semiconductor substrates by removing material from their surface. In some embodiments, the etcher apparatus may constitute an inductively-coupled plasma (ICP) reactor; in some embodiments, it may constitute a capacitively-coupled plasma (CCP) reactor. Thus, an etcher apparatus for use with these disclosed optimized EPMs may have a processing chamber, a substrate holder for holding a substrate within the processing chamber, and a plasma generator for generating a plasma within the processing chamber. The apparatus may further include one or more valve-controlled process gas inlets for flowing one or more process gases into the processing chamber, one or more gas outlets fluidically connected to one or more vacuum pumps for evacuating gases from the processing chamber, etc. Further details concerning etcher apparatuses (also generally referred to as etch reactors, or plasma etch reactors, etc.).

Context for Disclosed Computational Embodiments

Certain embodiments disclosed herein relate to systems for generating and/or using process simulation models. Certain embodiments disclosed herein relate to methods for generating and/or using a process simulation model implemented on such systems. A system for generating a process simulation model may be configured to analyze data for calibrating or optimizing the expressions or relationships used to represent the effects of a semiconductor device fabrication operation on a substrate. A system for generating a process simulation model may also be configured to receive data and instructions such as program code representing physical processes occurring during the semiconductor device fabrication operaiton. In this manner, a process simulation model is generated or programmed on such system. A programmed system for using a process simulation model may be configured to (i) receive input such as process parameters characterizing the semiconductor device fabrication operation and/or an initial design layout or mask for producing features in a substrate, and (ii) execute instructions that determine the effect of the semiconductor device fabrication operation on the substrate. To this end, the system may calculate time-dependent (or time-independent) result of a semiconductor device fabrication operation.

Many types of computing systems having any of various computer architectures may be employed as the disclosed systems for implementing process simulation models and algorithms for generating and/or optimizing such models. For example, the systems may include software components executing on one or more general purpose processors or specially designed processors such as programmable logic devices (e.g., Field Programmable Gate Arrays (FPGAs)). Further, the systems may be implemented on a single device or distributed across multiple devices. The functions of the computational elements may be merged into one another or further split into multiple sub-modules.

In some embodiments, code executed during generation or execution of a process simulation model on an appropriately programmed system can be embodied in the form of software elements which can be stored in a nonvolatile storage medium (such as optical disk, flash storage device, mobile hard disk, etc.), including a number of instructions for making a computer device (such as personal computers, servers, network equipment, etc.).

At one level a software element is implemented as a set of commands prepared by the programmer/developer. However, the module software that can be executed by the computer hardware is executable code committed to memory using "machine codes" selected from the specific machine language instruction set, or "native instructions," designed into the hardware processor. The machine language instruction set, or native instruction set, is known to, and essentially built into, the hardware processor(s). This is the "language" by which the system and application software communicates with the hardware processors. Each native instruction is a discrete code that is recognized by the processing architecture and that can specify particular registers for arithmetic, addressing, or control functions; particular memory locations or offsets; and particular addressing modes used to interpret operands. More complex operations are built up by combining these simple native instructions, which are executed sequentially, or as otherwise directed by control flow instructions.

The inter-relationship between the executable software instructions and the hardware processor is structural. In other words, the instructions per se are a series of symbols or numeric values. They do not intrinsically convey any information. It is the processor, which by design was preconfigured to interpret the symbols/numeric values, which imparts meaning to the instructions.

The models used herein may be configured to execute on a single machine at a single location, on multiple machines at a single location, or on multiple machines at multiple locations. When multiple machines are employed, the individual machines may be tailored for their particular tasks. For example, operations requiring large blocks of code and/or significant processing capacity may be implemented on large and/or stationary machines.

In addition, certain embodiments relate to tangible and/or non-transitory computer readable media or computer program products that include program instructions and/or data (including data structures) for performing various computer-implemented operations. Examples of computer-readable media include, but are not limited to, semiconductor memory devices, phase-change devices, magnetic media such as disk drives, magnetic tape, optical media such as CDs, magneto-optical media, and hardware devices that are specially configured to store and perform program instructions, such as read-only memory devices (ROM) and random access memory (RAM). The computer readable media may be directly controlled by an end user or the media may be indirectly controlled by the end user. Examples of directly controlled media include the media located at a user facility and/or media that are not shared with other entities. Examples of indirectly controlled media include media that is indirectly accessible to the user via an external network and/or via a service providing shared resources such as the "cloud." Examples of program instructions include both machine code, such as produced by a compiler, and files containing higher level code that may be executed by the computer using an interpreter.

In various embodiments, the data or information employed in the disclosed methods and apparatus is provided in an electronic format. Such data or information may include design layouts, fixed parameter values, floated parameter values, feature profiles, metrology results, and the like. As used herein, data or other information provided in electronic format is available for storage on a machine and transmission between machines. Conventionally, data in electronic format is provided digitally and may be stored as bits and/or bytes in various data structures, lists, databases, etc. The data may be embodied electronically, optically, etc.

In certain embodiments, a process simulation model can each be viewed as a form of application software that interfaces with a user and with system software. System software typically interfaces with computer hardware and associated memory. In certain embodiments, the system software includes operating system software and/or firmware, as well as any middleware and drivers installed in the system. The system software provides basic non-task-specific functions of the computer. In contrast, the modules and other application software are used to accomplish specific tasks. Each native instruction for a module is stored in a memory device and is represented by a numeric value.

Figure 7:
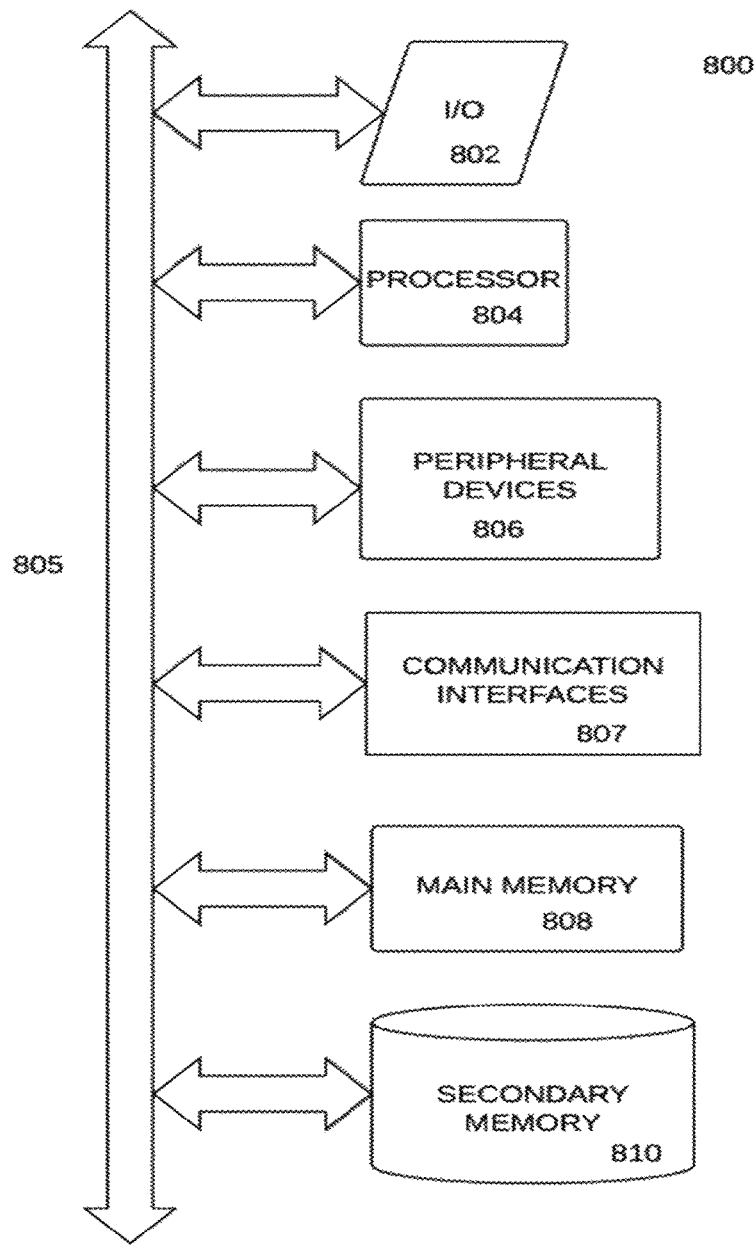
FIG. 7 shows an example computational system that may be used to optimize and/or use process simulation models.

An example computer system 800 is depicted in FIG. 7. As shown, computer system 800 includes an input/output subsystem 802, which may implement an interface for interacting with human users and/or other computer systems depending upon the application. Embodiments of the invention may be implemented in program code on system 800 with I/O subsystem 802 used to receive input program statements and/or data from a human user (e.g., via a GUI or keyboard) and to display them back to the user. The I/O subsystem 802 may include, e.g., a keyboard, mouse, graphical user interface, touchscreen, or other interfaces for input, and, e.g., an LED or other flat screen display, or other interfaces for output. Other elements of embodiments of the disclosure, such as the order placement engine 208, may be implemented with a computer system like that of computer system 800, perhaps, however, without I/O.

Program code may be stored in non-transitory media such as persistent storage 810 or memory 808 or both. One or more processors 804 reads program code from one or more non-transitory media and executes the code to enable the computer system to accomplish the methods performed by the embodiments herein, such as those involved with generating or using a process simulation model as described herein. Those skilled in the art will understand that the processor may accept source code, such as statements for executing training and/or modelling operations, and interpret or compile the source code into machine code that is understandable at the hardware gate level of the processor. A bus couples the I/O subsystem 802, the processor 804, peripheral devices 806, memory 808, and persistent storage 810.

Conclusion

In the description, numerous specific details were set forth in order to provide a thorough understanding of the presented embodiments. The disclosed embodiments may be practiced without some or all of these specific details. In other instances, well-known process operations were not described in detail to not unnecessarily obscure the disclosed embodiments. While the disclosed embodiments were described in conjunction with the specific embodiments, it will be understood that the specific embodiments are not intended to limit the disclosed embodiments.

What is claimed is:

1. A computer-implemented method of optimizing a process simulation model that predicts a result of a semiconductor device fabrication operation from process parameter values characterizing the semiconductor device fabrication operation, the method comprising:
   (a) receiving current values of one or more floated process model parameters to be optimized;
   (b) producing a configured process simulation model by providing to the process simulation model the current values of the one or more floated process model parameters and a set of fixed process model parameter value(s);
   (c) generating, using the configured process simulation model, a computationally predicted result of the semiconductor device fabrication operation, wherein the computationally predicted result comprises depth information of a substrate feature computed from the process simulation model;
   (d) comparing the computationally predicted result of the semiconductor device fabrication operation with a metrology result obtained from one or more substrate features produced, at least in part, by performing the semiconductor device fabrication operation in a reaction chamber operating under the set of fixed process parameter values, wherein the comparing produces one or more cost values based on a difference between the computationally predicted result of the semiconductor device fabrication operation and the metrology result;

(e) using the one or more cost values and/or a convergence check to generate an update of the current values of the one or more floated process model parameters;

(f) performing operation (b) with the update of the current values of the one or more floated process model parameters; and (g) repeating (c)-(f) until the current values of the one or more floated process model parameters converge to produce final values of the one or more floated process model parameters that minimize the cost values.

2. The method of claim 1, wherein the set of fixed process model parameter value(s) or the one or more floated process model parameters include one or more values of temperature in the reaction chamber, one or more RF conditions in the reaction chamber, one or more process gases in in the reaction chamber, a pressure in the reaction chamber, or any combination thereof.

3. The method of claim 1, wherein the one or more floated process model parameters comprise a combination of any two or more characteristics of a substrate undergoing the semiconductor device fabrication operation.

4. The method of claim 1, further comprising, prior to (c), providing an initial profile of a substrate undergoing the semiconductor device fabrication operation, whereby generating the computationally predicted result of the semiconductor device fabrication operation in (c) uses the initial profile.

5. The method of claim 1, wherein the result of a semiconductor device fabrication operation is a signal produced by interaction of incident electromagnetic radiation with an etched feature, a deposited feature, or a planarized feature.

6. The method of claim 1, wherein generating the computationally predicted result of the semiconductor device fabrication operation comprises:
(i) generating, using the configured process simulation model, a computed etch profile represented by a series of geometric profile coordinates; and
(ii) from the computed etch profile generated in (i), generating a computed reflectance or ellipsometric spectrum by simulating reflection of electromagnetic radiation off of said computed etch profile.

7. The method of claim 6, further comprising:
performing the semiconductor device fabrication operation on a test substrate under the set of fixed process parameter values to produce an etched substrate; and
exposing the etched substrate to incident electromagnetic radiation to produce an experimental reflection spectrum comprising the metrology result.

8. The method of claim 6, further comprising generating one or more additional computed reflectance or ellipsometric spectra.

9. The method of claim 1, wherein the result of a semiconductor device fabrication operation is a profile of an etched feature, a profile of a deposited feature, or a profile of a planarized feature.

10. The method of claim 1, wherein generating the computationally predicted result of the semiconductor device fabrication operation comprises generating, using the configured process simulation model, a computed etch profile represented by etch profile coordinates.

11. The method of claim 10, further comprising:
performing the semiconductor device fabrication operation on a test substrate under the set of fixed process parameter values to produce an etched substrate; and
measuring features of the etched substrate to produce experimental etch profile coordinates comprising the metrology result.

12. The method of claim 11, wherein measuring features of the etched substrate comprises performing microscopy, or optical metrology on the etched substrate.

13. The method of claim 1, wherein the result of a semiconductor device fabrication operation is a set of geometric profile parameters characterizing a geometry of an etched feature, a deposited feature, or a planarized feature.

14. The method of claim 13, wherein the geometric profile parameters are Optical Critical Dimension ("OCD") profile parameters.

15. The method of claim 1, wherein generating the computationally predicted result of the semiconductor device fabrication operation comprises:
(i) generating, using the configured process simulation model, a computed etch profile represented by a series of etch profile coordinates; and
(ii) converting the computed etch profile generated in (i) to a first set of geometric profile parameters characterizing a geometry of the of the computed etch profile.

16. The method of claim 15, further comprising:
performing the semiconductor device fabrication operation on a test substrate under the set of fixed process parameter values to produce an etched substrate;
measuring features of the etched substrate to produce experimental etch profile coordinates; and
converting the experimental etch profile coordinates to a second set of geometric profile parameters characterizing a geometry of an etched feature in the etched substrate.

17. The method of claim 1, wherein:
the computationally predicted result generated in (c) comprises a sequence of geometric profiles or profile parameters of the substrate feature computed from the configured process simulation model and corresponding to a sequence of times representing different durations of a substrate subtractive process or a substrate additive process; and
the metrology result of (d) comprises a sequence of geometric profiles or profile parameters of the substrate feature obtained from experimental measurements of a substrate at the different durations of the substrate subtractive process or the substrate additive process.

18. The method of claim 1, further comprising:
(i) configuring the process simulation model with the final values of the one or more floated process model parameters from (g); and
(ii) using the process simulation model configured with the final values of the one or more floated process model parameters from (g) to enable:
determining a pattern of a lithographic mask, and
creating the lithographic mask.

19. The method of claim 1, further comprising:
(i) configuring the process simulation model with the final values of the one or more floated process model parameters from (g); and
(ii) using the process simulation model configured with the final values of the one or more floated process model parameters from (g) to enable:

identifying a design of a semiconductor processing apparatus, and fabricating the semiconductor processing apparatus by using the design of the semiconductor processing apparatus.

20. The method of claim 1, further comprising:
(i) configuring the process simulation model with the final values of the one or more floated process model parameters from (g); and
(ii) using the process simulation model configured with the final values of the one or more floated process model parameters from (g) to identify operating conditions of a semiconductor processing apparatus to enable fabrication of semiconductor devices by operating the semiconductor processing apparatus under the operating conditions.

21. The method of claim 1, wherein generating the computationally predicted result comprises using the configured process simulation model to calculate local reaction rates at a grid of points representing a feature profile on a semiconductor substrate.

22. A computer program product comprising a non-transitory computer readable medium on which is provided instructions for causing a computational system to execute an optimized process simulation model that calculates a result of a semiconductor device fabrication operation from process parameter values characterizing the semiconductor device fabrication operation, wherein the instructions comprise instructions for:
(a) receiving process parameter values as inputs to the optimized process simulation model;
(b) executing the optimized process simulation model using the process parameter values, wherein the optimized process simulation model was optimized by:
(i) receiving current values of one or more floated process model parameters to be optimized,
(ii) producing a configured process simulation model by providing to the process simulation model the current values of the one or more floated process model parameters and a set of fixed process model parameter value(s),
(iii) generating, using the configured process simulation model, a computationally predicted result of the semiconductor device fabrication operation, wherein the computationally predicted result comprises depth information of a substrate feature computed from the process simulation model,
(iv) comparing the computationally predicted result of the semiconductor device fabrication operation with a metrology result obtained from one or more substrate features produced, at least in part, by performing the semiconductor device fabrication operation in a reaction chamber operating under the set of fixed process parameter values, wherein the comparing produces one or more cost values based on a difference between the computationally predicted result of the semiconductor device fabrication operation and the metrology result,
(v) using the one or more cost values and/or a convergence check to generate an update of the current values of the one or more floated process model parameters,
(vi) performing operation (ii) with the update of the current values of the one or more floated process model parameters, and
(vii) repeating (iii)-(vi) until the current values of the one or more floated process model parameters converge to produce final values of the one or more floated process model parameters that minimize the cost values; and
(c) outputting a calculated result of the semiconductor device fabrication operation.

23. The computer program product of claim 22, wherein the instructions further comprise instructions for, prior to (b), receiving an initial profile of a substrate undergoing the semiconductor device fabrication operation.

24. The computer program product of claim 22, wherein (ii) producing a configured process simulation model further comprises providing to the process simulation model a profile of a substrate before the substrate is subjected to the semiconductor device fabrication operation, wherein the profile of the substrate has one or more features that are to be modified by the semiconductor device fabrication operation.

25. The computer program product of claim 22, wherein the result of a semiconductor device fabrication operation is a signal produced by interaction of incident electromagnetic radiation with an etched feature, a deposited feature, or a planarized feature.

26. The computer program product of claim 22, wherein generating the computationally predicted result of the semiconductor device fabrication operation comprises:
generating, using the configured process simulation model, a computed etch profile represented by a series of geometric profile coordinates; and
from the computed etch profile, generating a computed reflectance or ellipsometric spectrum by simulating reflection of electromagnetic radiation off of said computed etch profile.

27. The computer program product of claim 22, wherein generating the computationally predicted result of the semiconductor device fabrication operation comprises generating, using the configured process simulation model, a computed etch profile represented by etch profile coordinates.

28. The computer program product of claim 22, wherein the result of a semiconductor device fabrication operation is a set of geometric profile parameters characterizing a geometry of an etched feature, a deposited feature, or a planarized feature.

29. The computer program product of claim 28, wherein the geometric profile parameters are Optical Critical Dimension ("OCD") profile parameters.

30. The computer program product of claim 22, further comprising instructions for using the calculated result to determine a pattern of a lithographic mask.

31. The computer program product of claim 22, further comprising instructions for using the calculated result to identify a design of a semiconductor processing apparatus.

32. The computer program product of claim 22, further comprising instructions for using the calculated result to identify operating conditions of a semiconductor processing apparatus to enable fabrication of semiconductor devices by operating the semiconductor processing apparatus under the operating conditions.

33. A system comprising the computer program product of claim 22 and a lithography mask generating apparatus configured to determine a lithographic mask pattern using the calculated result of the semiconductor device fabrication operation.

34. A system comprising the computer program product of claim 22 and a semiconductor processing apparatus configured to operate under process conditions provided in the calculated result of the semiconductor device fabrication operation.

\* \* \* \* \*